United States Patent
Shang et al.

(10) Patent No.: US 12,029,073 B2
(45) Date of Patent: Jul. 2, 2024

(54) DISPLAY SUBSTRATE AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Tinghua Shang, Beijing (CN); Yi Zhang, Beijing (CN); Haigang Qing, Beijing (CN); Pengfei Yu, Beijing (CN); Lulu Yang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 552 days.

(21) Appl. No.: 17/312,983

(22) PCT Filed: Aug. 31, 2020

(86) PCT No.: PCT/CN2020/112495
§ 371 (c)(1),
(2) Date: Jun. 11, 2021

(87) PCT Pub. No.: WO2022/041203
PCT Pub. Date: Mar. 3, 2022

(65) Prior Publication Data
US 2022/0320213 A1    Oct. 6, 2022

(51) Int. Cl.
*H10K 59/121* (2023.01)
*H01L 25/075* (2006.01)
(Continued)

(52) U.S. Cl.
CPC ..... *H10K 59/1213* (2023.02); *H10K 59/1216* (2023.02); *H10K 59/131* (2023.02); *H10K 59/353* (2023.02)

(58) Field of Classification Search
CPC .......... H10K 59/1213; H10K 59/1216; H10K 59/131; H10K 59/353; H10K 59/124;
(Continued)

(56) References Cited

U.S. PATENT DOCUMENTS

| 2016/0247452 A1 | 8/2016 | Lee et al. |
| 2017/0011685 A1 | 1/2017 | Jeon |

(Continued)

FOREIGN PATENT DOCUMENTS

| CN | 105895026 A | 8/2016 |
| CN | 107369690 A | 11/2017 |

(Continued)

*Primary Examiner* — Yara B Green
*Assistant Examiner* — Akhee Sarker-Nag
(74) *Attorney, Agent, or Firm* — ArentFox Schiff LLP; Michael Fainberg

(57) ABSTRACT

Embodiments of the present disclosure provide a display substrate and a display apparatus. The display substrate comprises: multiple repetition units, where at least one repetition unit includes multiple subpixels including first subpixels and second subpixels. In the first subpixel, an orthographic projection of an anode adapter portion on a base substrate does not overlap an orthographic projection of a drive active layer on the base substrate, and an orthographic projection of a main body portion on the base substrate does not overlap the orthographic projection of the anode adapter portion on the base substrate. In the second subpixel, an orthographic projection of an anode adapter portion on the base substrate overlaps an orthographic projection of a drive active layer on the base substrate, and an orthographic projection of a main body portion on the base substrate overlaps the orthographic projection of the anode adapter portion on the base substrate.

19 Claims, 15 Drawing Sheets

(51) Int. Cl.
*H10K 59/123* (2023.01)
*H10K 59/124* (2023.01)
*H10K 59/131* (2023.01)
*H10K 59/35* (2023.01)

(58) Field of Classification Search
CPC .............. H10K 59/123; G09G 3/3233; G09G 2300/0426; H01L 25/0753
See application file for complete search history.

(56) References Cited

U.S. PATENT DOCUMENTS

| | | |
|---|---|---|
| 2018/0342570 A1 | 11/2018 | Hong et al. |
| 2019/0064552 A1 | 2/2019 | Kim et al. |
| 2019/0280076 A1* | 9/2019 | Bang .................... H01L 27/124 |
| 2020/0194530 A1 | 6/2020 | Lee et al. |
| 2021/0005694 A1 | 1/2021 | Yi et al. |
| 2021/0193766 A1 | 6/2021 | Liu et al. |
| 2021/0233989 A1 | 7/2021 | Li et al. |

FOREIGN PATENT DOCUMENTS

| | | |
|---|---|---|
| CN | 108933155 A | 12/2018 |
| CN | 109427854 A | 3/2019 |
| CN | 109755276 A | 5/2019 |
| CN | 109786434 A | 5/2019 |
| CN | 110047898 A | 7/2019 |
| CN | 110246864 A | 9/2019 |
| CN | 110335564 A | 10/2019 |
| CN | 110707134 A | 1/2020 |
| CN | 111490068 A | 8/2020 |

\* cited by examiner

0310

DISPLAY SUBSTRATE AND DISPLAY APPARATUS

The present application is a National Stage of International Application No. PCT/CN2020/112495, filed on Aug. 31, 2020, the entire contents of which are incorporated herein by reference.

FIELD

Embodiments of the present disclosure relate to the field of display technologies, and in particular, to a display substrate and a display apparatus.

BACKGROUND

With continuous development of display technologies, organic light emitting diode (OLED) display substrates are increasingly applied to various electronic devices due to advantages such as self-luminance, a wide viewing angle, a great contrast ratio, low power consumption, and a high response speed. As people impose higher requirements on OLED display substrates, generally, SPR (Sub Pixel Rendering) pixel arrangement, namely, a manner of pixel borrowing, is used in an OLED display substrate, to implement a high-resolution design of the display substrate.

SUMMARY

An embodiment of the present disclosure provides a display substrate, including:
multiple subpixels, where at least one of the multiple subpixels includes a pixel circuit and a light-emitting element that are on a base substrate, and the pixel circuit includes a drive transistor, configured to drive the light-emitting element to emit light;
an active semiconductor layer, where a drive active layer of the drive transistor is located in the active semiconductor layer, and a drive gate of the drive transistor is electrically connected to the active semiconductor layer through a drive via hole; and
a first conducting layer, on a side of the active semiconductor layer away from the base substrate, where the first conducting layer includes anode adapter portions and signal lines that are disposed at intervals; and
where in each of the subpixels, an orthographic projection of at least a part of the drive via hole on the base substrate does not overlap orthographic projections of an anode adapter portion and signal lines on the base substrate.

In some examples, the display substrate further includes:
a first insulation layer, on a side of the first conducting layer away from the base substrate, where the first insulation layer includes a first via hole, and the first via hole exposes at least a part of the anode adapter portion;
the light-emitting element includes an anode, the anode is on a side of the first insulation layer away from the base substrate, the anode includes a main body portion and an auxiliary portion that are electrically connected, and the auxiliary portion is electrically connected to the anode adapter portion through the first via hole;
the multiple subpixels include first subpixels and second subpixels;
in each of the first subpixel, an orthographic projection of the anode adapter portion on the base substrate does not overlap an orthographic projection of the drive active layer on the base substrate, and an orthographic projection of the main body portion on the base substrate does not overlap the orthographic projection of the anode adapter portion on the base substrate; and
in each of the second subpixel, an orthographic projection of the anode adapter portion on the base substrate overlaps an orthographic projection of the drive active layer on the base substrate, and an orthographic projection of the main body portion on the base substrate overlaps the orthographic projection of the anode adapter portion on the base substrate.

In some examples, the anode adapter portion in the second subpixel includes a first sub anode adapter portion and a second sub anode adapter portion that are electrically connected, the first sub anode adapter portion has a hollow-out structure, the second sub anode adapter portion has a solid structure, and the auxiliary portion is electrically connected to the second sub anode adapter portion through the first via hole; and
in the second subpixel, an orthographic projection of the first sub anode adapter portion on the base substrate overlaps the orthographic projection of the drive active layer on the base substrate.

In some examples, the display substrate further includes a gate conducting layer between the active semiconductor layer and the first conducting layer, wherein the gate conducting layer includes a scanning line;
in a direction parallel with the base substrate, in the same second subpixel, an orthographic projection of the scanning line on the base substrate is on a side of the orthographic projection of the drive active layer on the base substrate away from an orthographic projection of the second sub anode adapter portion on the base substrate; and
in the second subpixel, the orthographic projection of the first sub anode adapter portion on the base substrate overlaps the orthographic projection of the scanning line on the base substrate.

In some examples, in the second subpixel, an orthographic projection of a hollow-out region of the hollow-out structure of the first sub anode adapter portion on the base substrate overlaps an orthographic projection of the drive via hole on the base substrate.

In some examples, the first sub anode adapter portion includes a first sub adapter portion and a second sub adapter portion that are disposed oppositely; and
in the second subpixel, the orthographic projection of the main body portion on the base substrate overlaps orthographic projections of two signal lines on the base substrate, and in a first direction, an orthographic projection of the first sub adapter portion on the base substrate is between an orthographic projection of the second sub adapter portion on the base substrate and the orthographic projections of the two signal lines on the base substrate.

In some examples, at least one of multiple repetition units includes a first color subpixel, a second color subpixel, a third color subpixel, and a fourth color subpixel, the multiple repetition units are arranged in the first direction to form repetition unit groups, the repetition unit groups are arranged in a second direction, and the first direction is different from the second direction;
the first subpixel includes the first color subpixel; and
the second subpixel includes at least one of the second color subpixel, the third color subpixel, and the fourth color subpixel.

In some examples, the second subpixel includes the second color subpixel; and in the second color subpixel, an orthographic projection of the main body portion on the base substrate overlaps an orthographic projection of a first sub anode adapter portion on the base substrate.

In some examples, in the second color subpixel, the orthographic projection of the main body portion on the base substrate overlaps both of an orthographic projection of a first sub adapter portion on the base substrate and an orthographic projection of a second sub adapter portion on the base substrate.

In some examples, the main body portion in the second color subpixel has a second main body symmetrical axis in the second direction; and in the second color subpixel, a center line, of parts, where the orthographic projections of the two signal lines on the base substrate overlap with the orthographic projection of the main body portion on the base substrate, of the two signal lines, in the second direction and a center line of the first sub adapter portion and the second sub adapter portion in the second direction are respectively on two opposite sides of the second main body symmetrical axis.

In some examples, the second subpixel includes the fourth color subpixel; and in the fourth color subpixel, an orthographic projection of the main body portion on the base substrate overlaps an orthographic projection of a second sub anode adapter portion on the base substrate, and the orthographic projection of the main body portion on the base substrate overlaps orthographic projections of two signal lines on the base substrate.

In some examples, in the second direction, in the fourth color subpixel, an orthographic projection of at least a part of the main body portion on the base substrate is on a side of the orthographic projection of the second sub anode adapter portion on the base substrate away from an orthographic projection of a first sub anode adapter portion on the base substrate.

In some examples, the main body portion in the fourth color subpixel has a fourth main body symmetrical axis in the second direction; and in the fourth color subpixel, a center line, of parts, where the orthographic projections of the two signal lines on the base substrate overlap with the orthographic projection of the main body portion on the base substrate, of the two signal lines, in the second direction and a center line of the second sub anode adapter portion in the second direction are respectively on two opposite sides of the fourth main body symmetrical axis.

In some examples, each of the signal lines further includes a signal protrusion portion, the multiple signal lines include first signal lines and second signal lines, one column of subpixels corresponds to one first signal line and one second signal line, a signal protrusion portion of the first signal line is electrically connected to subpixels in an odd-numbered row, and a signal protrusion portion of the second signal line is electrically connected to subpixels in an even-numbered row;

the second color subpixel and the fourth color subpixel respectively located in repetition units that are adjacent to each other in the second direction are adjacent in the second direction; and in the second direction, the orthographic projection of the main body portion in the fourth color subpixel on the base substrate overlaps an orthographic projection of a signal protrusion portion in the adjacent second color subpixel on the base substrate.

In some examples, each of the signal lines further includes a signal protrusion portion, the multiple signal lines include first signal lines and second signal lines, one column of subpixels corresponds to one first signal line and one second signal line, a signal protrusion portion of the first signal line is electrically connected to subpixels in an odd-numbered row, and a signal protrusion portion of the second signal line is electrically connected to subpixels in an even-numbered row; and in two first signal lines and two second signal lines that correspond to two adjacent columns of subpixels, the two first signal lines are adjacent to form a first signal line group, or the two second signal lines are adjacent to form a second signal line group.

In some examples, an area of an orthographic projection of a second sub anode adapter portion in one fourth color subpixel on the base substrate is greater than an area of an orthographic projection of a second sub anode adapter portion in one second color subpixel on the base substrate.

In some examples, the orthographic projection of a second sub anode adapter portion in the second color subpixel on the base substrate has a second width in the second direction, the orthographic projection of the second sub anode adapter portion in the fourth color subpixel on the base substrate has a fourth width in the second direction, and the fourth width is greater than the second width.

In some examples, the second subpixel includes the third color subpixel; and in the third color subpixel, an orthographic projection of the main body portion on the base substrate overlaps an orthographic projection of a first sub anode adapter portion on the base substrate, and the orthographic projection of the main body portion on the base substrate overlaps orthographic projections of two signal lines on the base substrate.

In some examples, in the third color subpixel, the orthographic projection of the main body portion on the base substrate overlaps both of an orthographic projection of a first sub adapter portion on the base substrate and an orthographic projection of a second sub adapter portion on the base substrate.

In some examples, the main body portion in the third color subpixel has a third main body symmetrical axis in the second direction; and in the third color subpixel, a center line, of parts, where the orthographic projections of the two signal lines on the base substrate overlap with the orthographic projection of the main body portion on the base substrate, of the two signal lines, in the second direction and a center line of the first sub adapter portion and the second sub adapter portion in the second direction are respectively located on two opposite sides of the third main body symmetrical axis.

In some examples, in the third color subpixel, the orthographic projection of the main body portion on the base substrate overlaps an orthographic projection of a signal protrusion portion on the base substrate.

In some examples, in the third color subpixel, the signal protrusion portion is on a side of the first sub anode adapter portion away from a second sub anode adapter portion.

In some examples, in the first color subpixel, an orthographic projection of the main body portion on the base substrate overlaps orthographic projections of two signal lines on the base substrate, and the orthographic projection of the main body portion on the base substrate does not overlap orthographic projections of an anode adapter portion and a signal protrusion portion on the base substrate.

In some examples, the main body portion in the first color subpixel has a first main body symmetrical axis in the second direction; and in the first color subpixel, in the second direction, the two signal lines, the orthographic projections of which on the base substrate overlaps the orthographic projection of the main body portion on the base substrate, are respectively located on two opposite sides of the first main body symmetrical axis.

In some examples, a ratio of a distance between a first sub adapter portion and a second sub adapter portion of the same first sub anode adapter portion in the first direction to a distance between the two signal lines in the first direction ranges from 0.8 to 1.2.

In some examples, the signal lines are configured as data lines used to transmit data signals.

An embodiment of the present disclosure provides a display apparatus, including the foregoing display substrate.

DETAILED DESCRIPTION OF THE EMBODIMENTS

Figure 1:
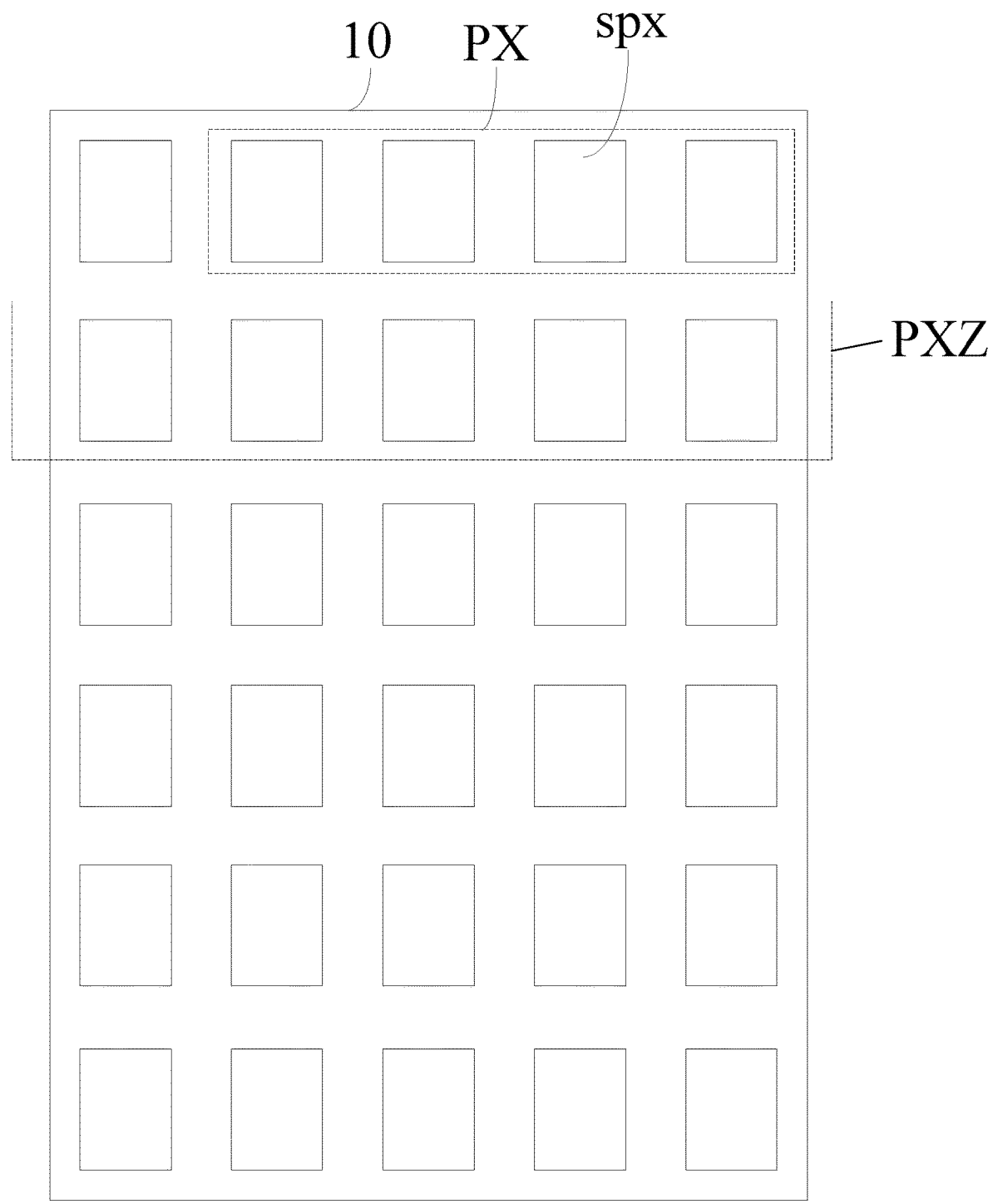
FIG. 1 is a schematic structural diagram of a display substrate according to embodiments of the present disclosure.

To make the purpose, technical solutions, and advantages of the embodiments of the present disclosure clearer, the following clearly and completely describes the technical solutions of the embodiments of the present disclosure with reference to the accompanying drawings in the embodiments of the present invention. Apparently, the described embodiments are merely some but not all of the embodiments of the present disclosure. In addition, in a case of no conflict, the embodiments of the present disclosure may be combined and features in the embodiments may be combined. All other embodiments obtained by a person of ordinary skill in the art based on the described embodiments of the present disclosure without creative efforts shall fall within the protection scope of the present disclosure.

Unless otherwise defined, technical or scientific terms used in the present disclosure shall have an ordinary meaning as understood by a person of ordinary skill in the art to which the present disclosure belongs. The words "first," "second," and the like used in the present disclosure do not represent any sequence, quantity, or importance, but are used only to differentiate between different composition parts. The word "including", "containing", or the like is intended to mean that an element or an object appearing before the word covers an element or an object and the equivalent thereof appearing after the word, and other elements or objects are not excluded. The word "connecting", "connected", or the like is not limited to a physical or mechanical connection, but may include an electrical connection, whether direct or indirect.

It should be noted that sizes and shapes of the figures in the accompanying drawings do not reflect the real scale and are intended only to schematically illustrate content of the present disclosure. In addition, same or similar reference numerals represent same or similar elements or elements having same or similar functions throughout.

As shown in FIG. 1, a display substrate provided in an embodiment of the present disclosure may include a base substrate 10, and multiple repetition units PX on the base substrate 10. At least one (for example, each repetition unit) of the multiple repetition units PX may include multiple subpixels spx. For example, the multiple subpixels may include a first color subpixel spx1, a second color subpixel spx2, a third color subpixel spx3, and a fourth color subpixel spx4. In other words, the repetition unit may include the first color subpixel spx1, the second color subpixel spx2, the third color subpixel spx3, and the fourth color subpixel spx4. In this way, the display substrate can display color through the mixed light of the first color subpixel spx1, the second color subpixel spx2, the third color subpixel spx3, and the fourth color subpixel spx4. In some examples, each of a first color of the first color subpixel spx1, a second color of the second color subpixel spx2, a third color of the third color subpixel spx3, and a fourth color of the fourth color subpixel spx4 may be selected from red, green, and blue. For example, the first color is red, the second color is green, the third color is blue, and the fourth color is green. Certainly, this embodiment of the present disclosure is not limited thereto. Description is provided below by using an example in which the repetition unit includes the first color subpixel spx1, the second color subpixel spx2, the third color subpixel spx3, and the fourth color subpixel spx4, the second color and the fourth color are green, the first color is red, and the third color is blue.

For example, as shown in FIG. 1, the multiple repetition units are arranged in a first direction F1 to form repetition unit groups PXZ, and the repetition unit groups PXZ are arranged in a second direction F2. The first direction F1 is different from the second direction F2. For example, the first direction F1 is perpendicular to the second direction F2. For example, the first direction F1 is a row direction, and the second direction F2 is a column direction. Alternatively, the first direction F1 is a column direction, and the second direction F2 is a row direction.

Figure 2A:
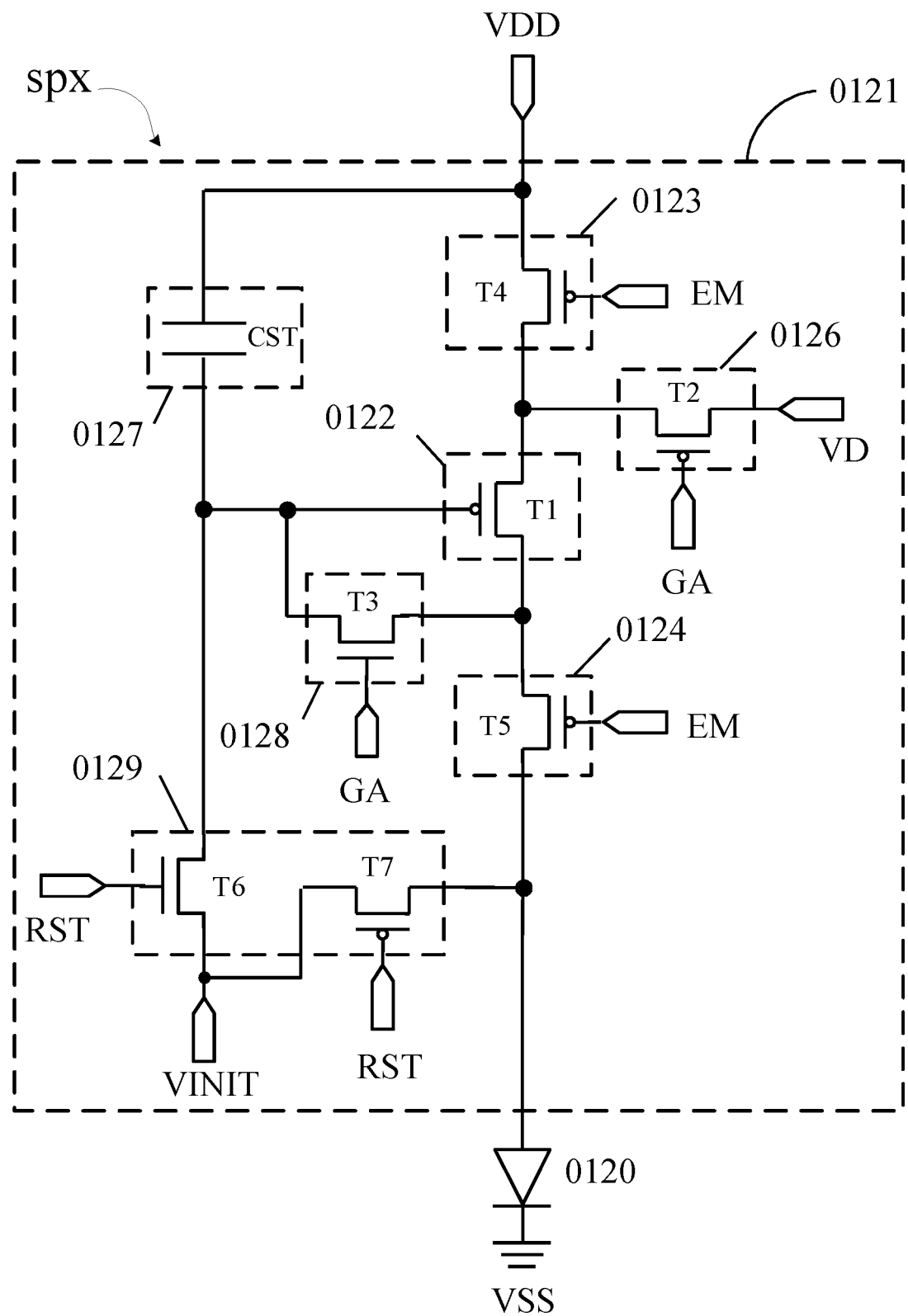
FIG. 2A is a schematic structural diagram of some pixel circuits according to the embodiments of the present disclosure.

For example, as shown in FIG. 1 and FIG. 2A, at least one (for example, each subpixel) of the multiple subpixels spx may include a pixel circuit 0121 and a light-emitting element 0120. The pixel circuit 0121 includes a transistor and a capacitor, generates an electrical signal through interaction between the transistor and the capacitor, and inputs the generated electrical signal to an anode of the light-emitting element 0120. In addition, a corresponding voltage is applied to a cathode of the light-emitting element 0120, to drive the light-emitting element 0120 to emit light.

As shown in FIG. 2A, the pixel circuit 0121 may include a drive control circuit 0122, a first light-emitting control circuit 0123, a second light-emitting control circuit 0124, a data write circuit 0126, a storage circuit 0127, a threshold compensation circuit 0128, and a reset circuit 0129.

The drive control circuit 0122 may include a control terminal, a first terminal, and a second terminal. In addition, the drive control circuit 0122 is configured to provide, for the light-emitting element 0120, a drive current used to drive the light-emitting element 0120 to emit light. For example, the first light-emitting control circuit 0123 is connected to the first terminal of the drive control circuit 0122 and a first voltage terminal VDD. In addition, the first light-emitting control circuit 0123 is configured to implement connection or disconnection between the drive control circuit 0122 and the first voltage terminal VDD.

The second light-emitting control circuit 0124 is electrically connected to the second terminal of the drive control circuit 0122 and the anode of the light-emitting element 0120. In addition, the second light-emitting control circuit 0124 is configured to implement connection or disconnection between the drive control circuit 0122 and the light-emitting element 0120.

The data write circuit 0126 is electrically connected to the first terminal of the drive control circuit 0122. In addition, the data write circuit 0126 is configured to write a data signal on a data line VD into the storage circuit 0127.

The storage circuit 0127 is electrically connected to the control terminal of the drive control circuit 0122 and the first voltage terminal VDD. In addition, the storage circuit 0127 is configured to store information about the drive control circuit 0122 and the data signal.

The threshold compensation circuit 0128 is separately electrically connected to the control terminal of and the second terminal of the drive control circuit 0122. In addition, the threshold compensation circuit 0128 is configured to perform threshold compensation for the drive control circuit 0122.

The reset circuit 0129 is further separately electrically connected to the control terminal of the drive control circuit 0122 and the anode of the light-emitting element 0120. In addition, the reset circuit 0129 is configured to reset the anode of the light-emitting element 0120, and reset the control terminal of the drive control circuit 0122.

The light-emitting element 0120 may be set to an electroluminescent diode, for example, at least one of an OLED, a QLED, a micro LED, and a mini OLED. The light-emitting element 0120 may include the anode, a light-emitting layer, and the cathode that are stacked. Further, the light-emitting layer may further include film layers such as a hole injection layer, a hole transport layer, an electron transport layer, and an electron injection layer. Certainly, during actual application, the light-emitting element 0120 may be designed and determined based on a requirement of an actual application environment. This is not limited herein.

For example, as shown in FIG. 2A, the drive control circuit 0122 includes a drive transistor T1, the control terminal of the drive control circuit 0122 includes a drive gate of the drive transistor T1, the first terminal of the drive control circuit 0122 includes a first electrode of the drive transistor T1, and the second terminal of the drive control circuit 0122 includes a second electrode of the drive transistor T1.

For example, as shown in FIG. 2A, the data write circuit 0126 includes a data write transistor T2. The storage circuit 0127 includes a storage capacitor CST. The threshold compensation circuit 0128 includes a threshold compensation transistor T3. The first light-emitting control circuit 0123 includes a first light-emitting control transistor T4. The second light-emitting control circuit 0124 includes a second light-emitting control transistor T5. The reset circuit 0129 includes an initialization transistor T6 and a reset transistor T7.

Specifically, a first electrode of the data write transistor T2 is electrically connected to the first electrode of the drive transistor T1, a second electrode of the data write transistor T2 is configured to be electrically connected to the data line VD to receive the data signal, and a gate of the data write transistor T2 is configured to be electrically connected to a scanning line GA to receive a signal.

A first electrode of the storage capacitor CST is electrically connected to a first power terminal VDD, and a second electrode of the storage capacitor CST is electrically connected to the drive gate of the drive transistor T1.

A first electrode of the threshold compensation transistor T3 is electrically connected to the second electrode of the drive transistor T1, a second electrode of the threshold compensation transistor T3 is electrically connected to the drive gate of the drive transistor T1, and a gate of the threshold compensation transistor T3 is configured to be electrically connected to the scanning line GA to receive a signal.

A first electrode of the initialization transistor T6 is electrically connected to an initialization line VINIT to receive a reset signal, a second electrode of the initialization transistor T6 is electrically connected to the drive gate of the drive transistor T1, and a gate of the initialization transistor T6 is configured to be electrically connected to a reset line RST to receive a signal.

A first electrode of the reset transistor T7 is configured to be electrically connected to the initialization line VINIT to receive a reset signal, a second electrode of the reset transistor T7 is electrically connected to the anode of the light-emitting element 0120, and a gate of the reset transistor T7 is configured to be electrically connected to the reset line RST to receive a signal.

Figure 2B:
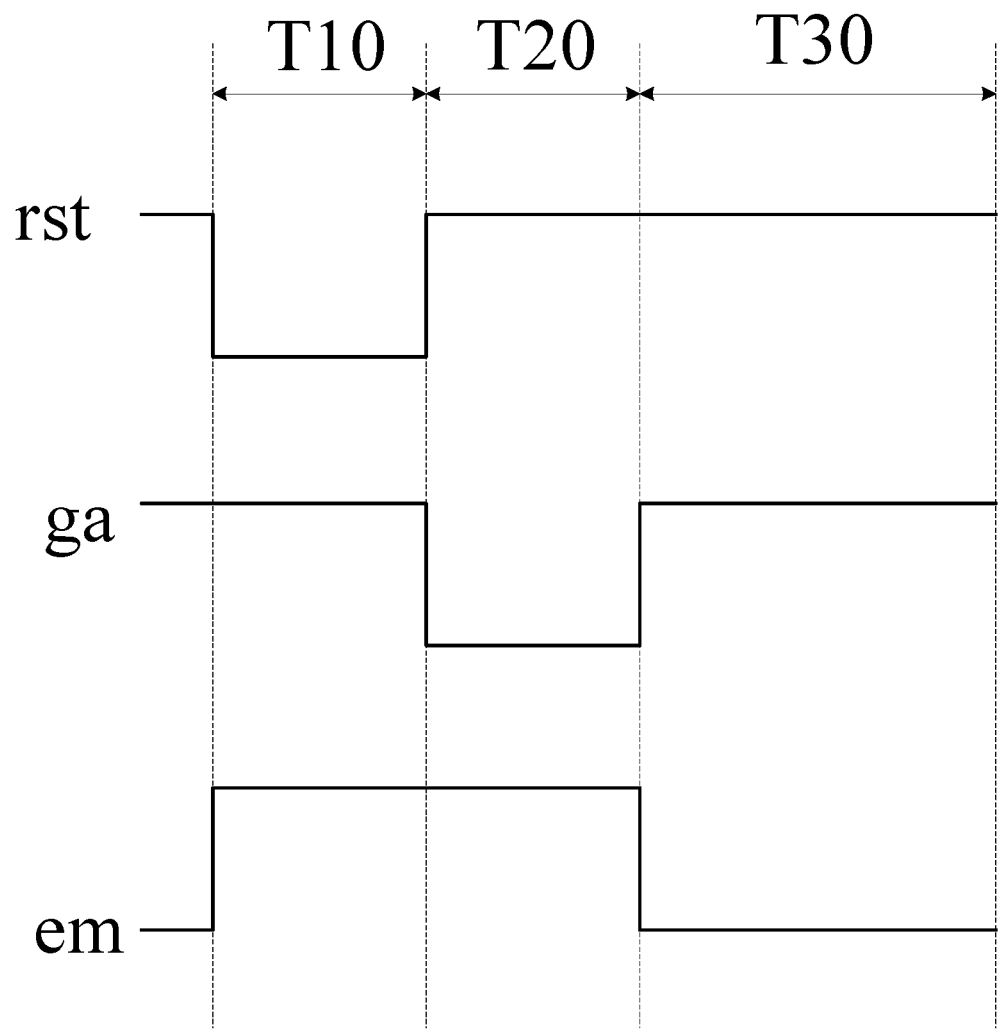
FIG. 2B is a signal sequence diagram according to the embodiments of the present disclosure.
Figure 2C:
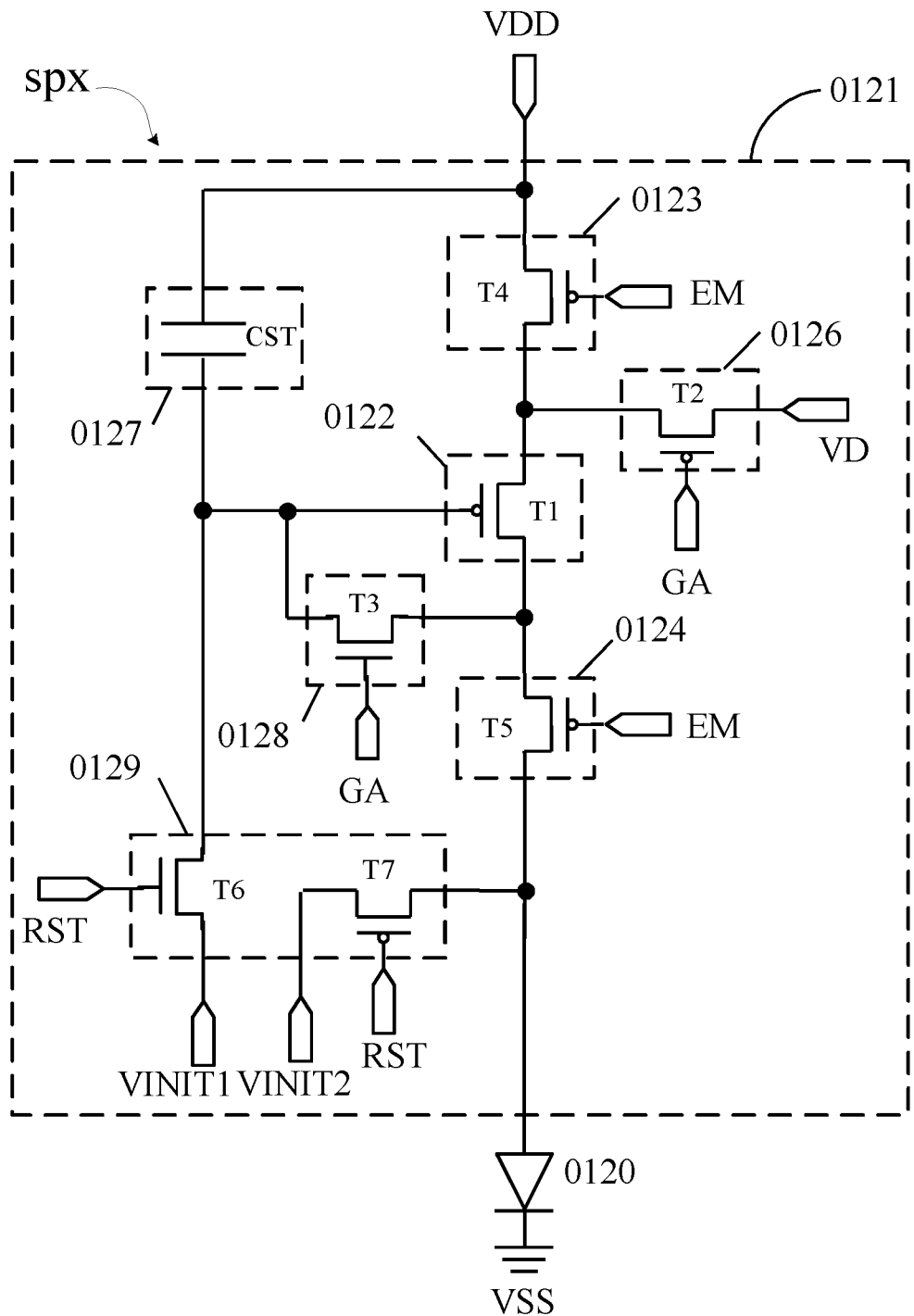
FIG. 2C is a schematic structural diagram of some pixel circuits according to the embodiments of the present disclosure.

Alternatively, as shown in FIG. 2C, the first electrode of the initialization transistor T6 is configured to be electrically connected to the initialization line VINIT1 to receive a first reset signal, the second electrode of the initialization transistor T6 is electrically connected to the drive gate of the drive transistor T1, and the gate of the initialization transistor T6 is electrically connected to the reset line RST to receive a signal. The first electrode of the reset transistor T7 is electrically connected to an initialization line VINIT2 to receive a second reset signal, the second electrode of the reset transistor T7 is electrically connected to the anode of the light-emitting element 0120, and the gate of the reset transistor T7 is electrically connected to the reset line RST to receive a signal. In this way, the initialization transistor T6 and the reset transistor T7 can receive different reset signals.

A first electrode of the first light-emitting control transistor T4 is electrically connected to the first power terminal VDD, a second electrode of the first light-emitting control transistor T4 is electrically connected to the first electrode of the drive transistor T1, and a gate of the first light-emitting control transistor T4 is electrically connected to a light-emitting control line EM to receive a light-emitting control signal.

A first electrode of the second light-emitting control transistor T5 is electrically connected to the second electrode of the drive transistor T1, a second electrode of the second light-emitting control transistor T5 is electrically connected to the anode of the light-emitting element 0120, and a gate of the second light-emitting control transistor T5 is electrically connected to the light-emitting control line EM to receive the light-emitting control signal.

The cathode of the light-emitting element 0120 is electrically connected to a second power terminal VSS. The first electrode and the second electrode of the above transistor may be determined as a source or a drain based on an actual application. This is not limited herein.

For example, one of the first power terminal VDD and the second power terminal VSS is a high voltage terminal, and the other is a low voltage terminal. For example, in the embodiment shown in FIG. 2A, the first power terminal VDD is a voltage source to output a constant first voltage, for example, the first voltage is a positive voltage; and the second power terminal VSS may be a voltage source to output a constant second voltage, for example, the second voltage is 0 or a negative voltage. For example, in some examples, the second power terminal VSS may be grounded.

A signal sequence diagram corresponding to the pixel circuit shown in FIG. 2A is shown in FIG. 2B. In one-frame for display, a working process of the pixel circuit includes three stages: a T10 stage, a T20 stage, and a T30 stage, where rst represents a signal transmitted on the reset line RST, ga represents a signal transmitted on the scanning line GA, and em represents a signal transmitted on the light-emitting control line EM.

At the T10 stage, the signal rst controls the initialization transistor T6 to be turned on, so that a signal transmitted on the initialization line VINIT can be provided for the drive gate of the drive transistor T1, to reset the drive gate of the drive transistor T1. The signal rst controls the reset transistor T7 to be turned on, so that the signal transmitted on the initialization line VINIT is provided for the anode of the light-emitting element 0120, to reset the anode of the light-emitting element 0120. In addition, at this stage, the signal ga controls the data write transistor T2 and the threshold compensation transistor T3 to be turned off. The signal em controls the first light-emitting control transistor T4 and the second light-emitting control transistor T5 to be turned off At the T20 stage, the signal ga controls the data write transistor T2 and the threshold compensation transistor T3 to be turned on, and the data write transistor T2 which is turned on enables the data signal, transmitted on the data line VD, to charge the drive gate of the drive transistor T1, so that a voltage on the drive gate of the drive transistor T1 is changed to Vdata+Vth, where Vth represents a threshold voltage of the drive transistor T1, and Vdata represents a voltage of the data signal. In addition, at this stage, the signal rst controls the initialization transistor T6 and the reset transistor T7 to be turned off. The signal em controls the first light-emitting control transistor T4 and the second light-emitting control transistor T5 to be turned off.

At the T30 stage, the signal em controls the first light-emitting control transistor T4 and the second light-emitting control transistor T5 to be turned on. The first light-emitting control transistor T4 which is turned on provides a voltage Vdd on the first power terminal VDD for the first electrode of the drive transistor T1, so that a voltage on the first electrode of the drive transistor T1 is Vdd. The drive transistor T1 generates a drive current based on a voltage Vdata+|Vth| on the gate of the drive transistor T1 and the voltage Vdd on the first electrode. The drive current is provided for the light-emitting element 0120 through the second light-emitting control transistor T5 which is turned on, to drive the light-emitting element 0120 to emit light. In addition, at this stage, the signal rst controls the initialization transistor T6 and the reset transistor T7 to be turned off. The signal ga controls the data write transistor T2 and the threshold compensation transistor T3 to be turned off It should be noted that in this embodiment of the present disclosure, the first electrode of the transistor may be a source and the second electrode is a drain, or the first electrode is a drain and the second electrode is a source. This may be designed and determined based on a requirement of an actual application. In addition to the structures shown in FIG. 2A and FIG. 2B, the pixel circuit of the subpixel may further have a structure including another quantity of transistors. This is not limited in this embodiment of the present disclosure. Description is provided below by using the structure shown in FIG. 2A as an example.

For example, the display substrate includes the base substrate 10, a transistor array layer on the base substrate 10, a first conducting layer on a side of the transistor array layer away from the base substrate 10, a first insulation layer on a side of the first conducting layer away from the base substrate 10, an anode on a side of the first insulation layer away from the base substrate 10, a light-emitting layer on a side of the anode away from the base substrate 10, and a cathode on a side of the light-emitting layer away from the base substrate 10. The transistor array layer may be configured to form the transistor(s) and the capacitor(s) of the pixel circuit, and form the scanning line(s), the reset line(s), the light-emitting control line(s) EM, the initialization line(s) VINIT, the first power signal line VDD of the first power terminal VDD, and the like. For example, the transistor array layer may include an active semiconductor layer 0310, a gate conducting layer 0320, a reference conducting layer 0330, and a source-drain metal layer 0340.

Figure 3:
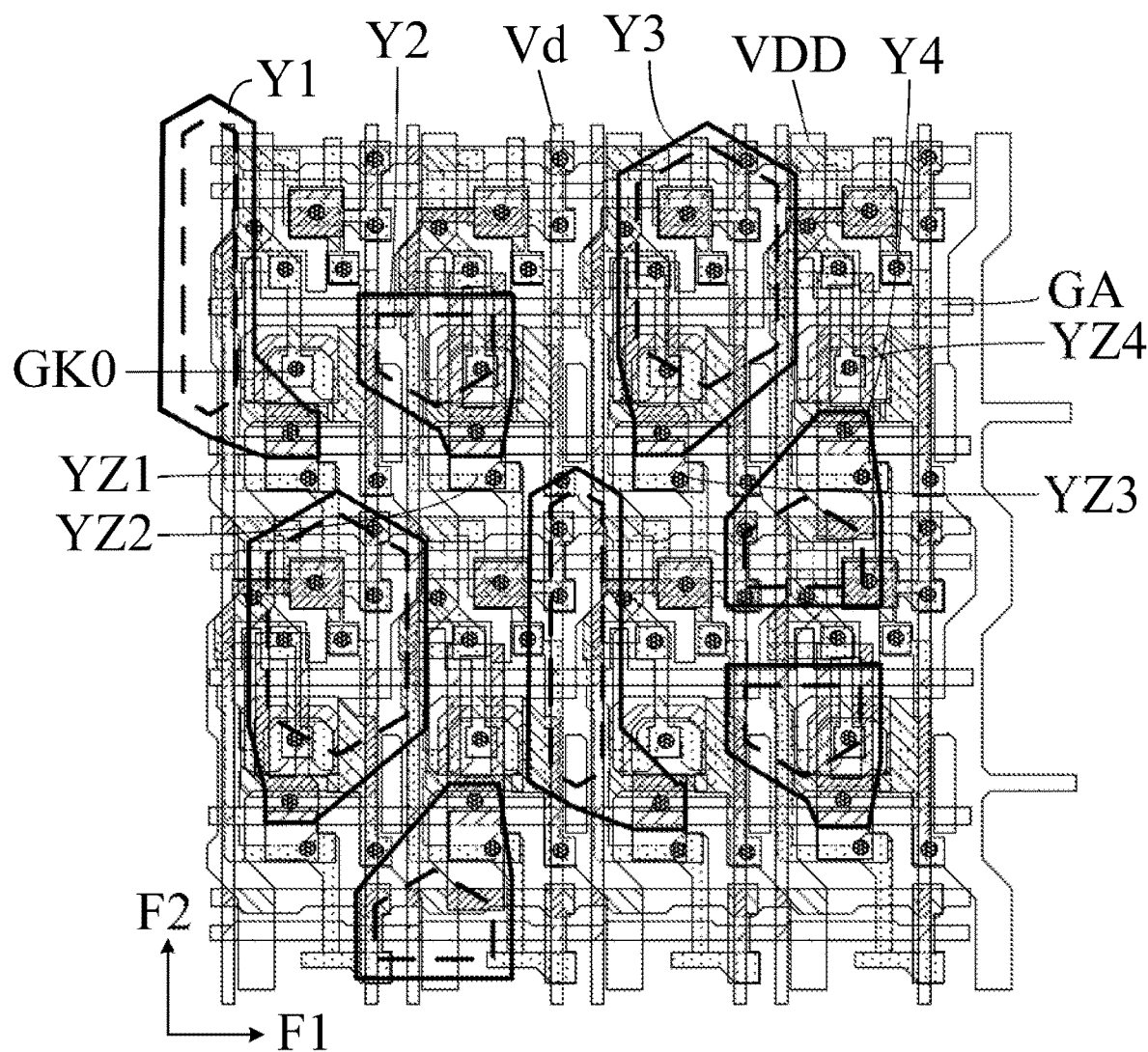
FIG. 3 is a schematic structural diagram of a layout of some display substrates according to the embodiments of the present disclosure.
Figure 4A:
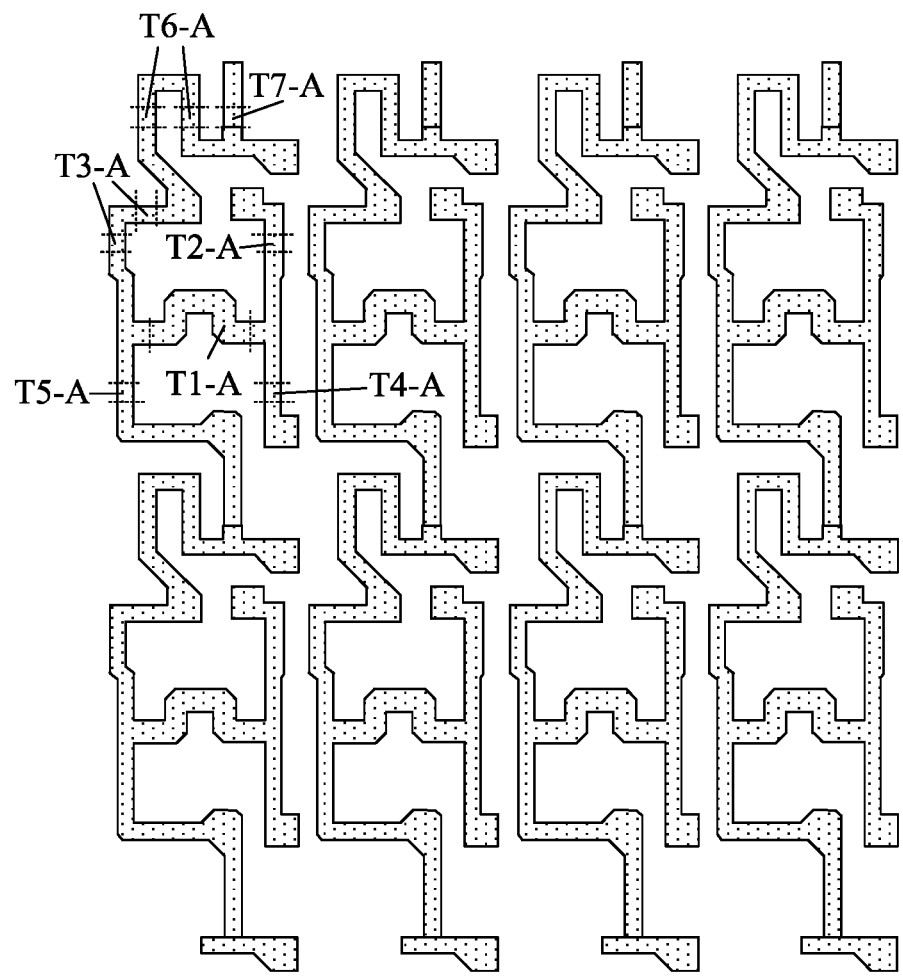
FIG. 4A is a schematic structural diagram of a layout of an active semiconductor layer according to the embodiments of the present disclosure.

For example, FIG. 3 and FIG. 4A show the active semiconductor layer 0310 of the pixel circuit 0121. The active semiconductor layer 0310 may be formed through patterning by using a semiconductor material. The active semiconductor layer 0310 may be used to form a drive active layer T1-A of the drive transistor T1, an active layer T2-A of the data write transistor T2, an active layer T3-A of the threshold compensation transistor T3, an active layer T4-A of the first light-emitting control transistor T4, an active layer T5-A of the second light-emitting control transistor T5, an active layer T6-A of the initialization transistor T6, and an active layer T7-A of the reset transistor T7. Each active layer may include a source region, a drain region, and a channel region between the source region and the drain region. For example, the active layer of each transistor is integrally disposed.

For example, the active semiconductor layer 0310 may be made of an amorphous silicon semiconductor material, a polysilicon semiconductor material, an oxide semiconductor material, and the like. It should be noted that the source region and the drain region may be regions doped with n-type impurities or p-type impurities.

Figure 4B:
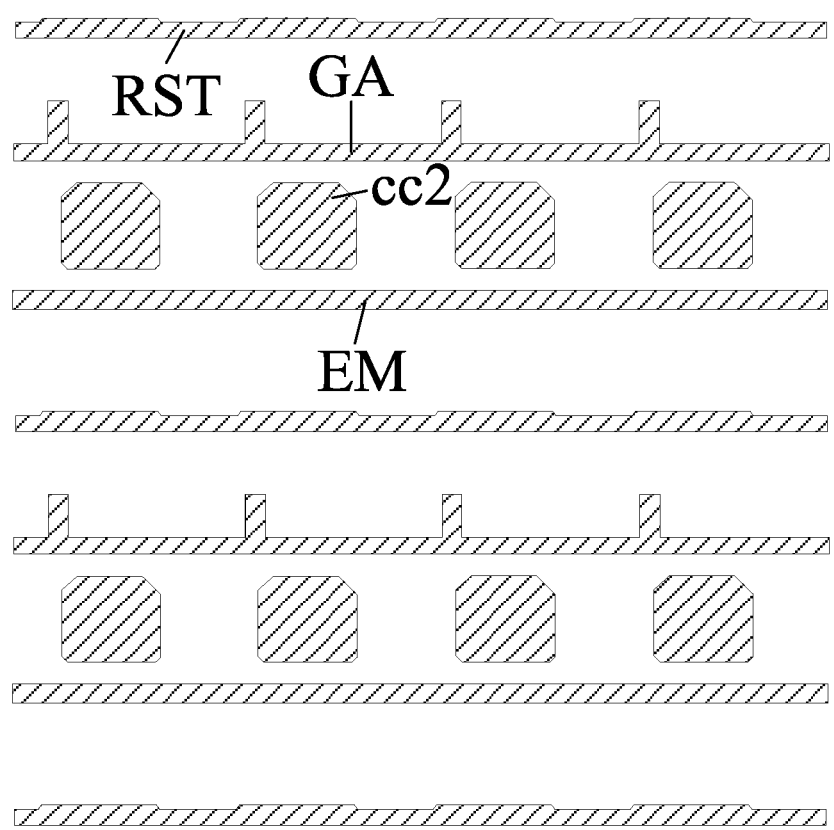
FIG. 4B is a schematic structural diagram of a layout of a gate conducting layer according to the embodiments of the present disclosure.

For example, a gate insulation layer is formed on the active semiconductor layer 0310 to protect the active semiconductor layer 0310. FIG. 3 and FIG. 4B show the gate conducting layer 0320 of the pixel circuit 0121, and the gate conducting layer 0320 is on the gate insulation layer, to be insulated from the active semiconductor layer 0310. The gate conducting layer 0320 may include a second electrode cc2 of the storage capacitor CST, a scanning line GA, a reset line RST, a light-emitting control line EM, and gates of the drive transistor T1, the data write transistor T2, the threshold compensation transistor T3, the first light-emitting control transistor T4, the second light-emitting control transistor T5, the initialization transistor T6, and the reset transistor T7.

For example, as shown in FIG. 4B, the gate of the data write transistor T2 may be a part, where projections of the scanning line GA and the active semiconductor layer 0310 overlap with each other, of the scanning line GA, the gate of the first light-emitting control transistor T4 may be a first part, where projections of the light-emitting control line EM and the active semiconductor layer 0310 overlap with each other, of the light-emitting control line EM, the gate of the second light-emitting control transistor T5 may be a second part, where projections of the light-emitting control line EM and the active semiconductor layer 0310 overlap with each other, of the light-emitting control line EM, the gate of the initialization transistor T6 is a first part, where projections of the reset line RST and the active semiconductor layer 0310 overlap with each other, of the reset line RST, the gate of the reset transistor T7 is a second part, where projections of the reset line RST and the active semiconductor layer 0310 overlap with each other, of the reset line RST, the threshold compensation transistor T3 may be a thin-film transistor having a double-gate, a first gate of the threshold compensation transistor T3 may be a part, where projections of the scanning line GA and the active semiconductor layer 0310 overlap with each other, of the scanning line GA, and a second gate of the threshold compensation transistor T3 may be a part, where projections of the active semiconductor layer 0310 and a protrusion portion of the scanning line GA overlap with each other, of the scanning line GA. As shown in FIG. 3 and FIG. 4B, the drive gate of the drive transistor T1 may be the second electrode cc2 of the storage capacitor CST.

It should be noted that dashed lines in FIG. 4A show parts where the gate semiconductor layer 0320 overlaps with the active semiconductor layer 0310.

For example, as shown in FIG. 3 and FIG. 4B, the scanning lines GA, the reset lines RST, and the light-emitting control lines EM are arranged in the second direction F2. In addition, the scanning lines GA, the reset lines RST, and the light-emitting control lines EM approximately extend in the first direction F1. For example, the scanning line GA is between the reset line RST and the light-emitting control line EM. For example, FIG. 3 is merely described by using an example in which the second direction F2 is a column direction and the first direction F1 is a row direction.

For example, in the second direction F2, the second electrode cc2 of the storage capacitor CST is between the scanning line GA and the light-emitting control line EM. In addition, protrusion portions of the scanning line GA are on a side of the scanning line GA away from the light-emitting control line EM.

Figure 4C:
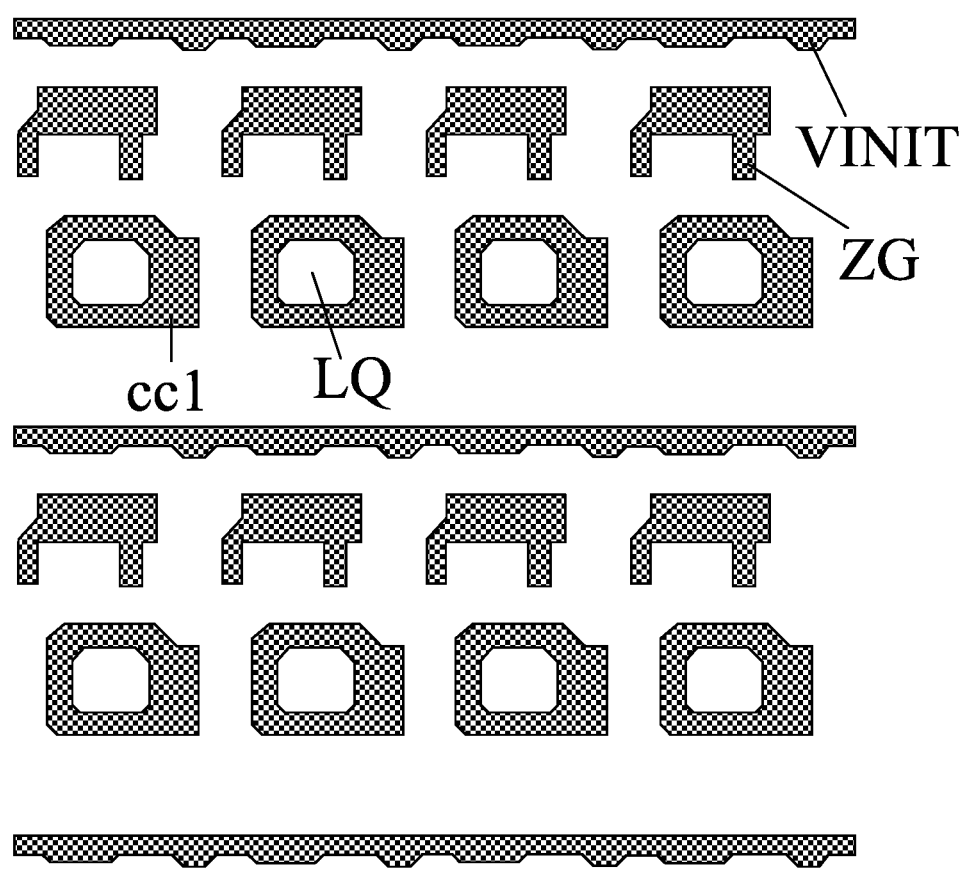
FIG. 4C is a schematic structural diagram of a layout of a reference conducting layer according to the embodiments of the present disclosure.

For example, an interlayer dielectric layer is formed on the gate conducting layer 0320, to protect the gate conducting layer 0320. FIG. 3 and FIG. 4C show the reference conducting layer 0330 of the pixel circuit 120. The reference conducting layer 0330 includes a first electrode cc1 of the storage capacitor CST, the initialization line VINIT, and a light shielding layer ZG. The first electrode cc1 and the second electrode cc2, the projections of which on the base substrate 10 at least partially overlap with each other, of the storage capacitor CST to form the storage capacitor CST. For example, the first electrode cc1 of the storage capacitor CST has a hollow-out region LQ, and the hollow-out region LQ may expose a part of the second electrode cc2 of the storage capacitor CST.

For example, as shown in FIG. 3 and FIG. 4C, an orthographic projection of the light shielding layer ZG on the base substrate 10 overlaps an orthographic projection, of the source region (for example, the source region of the reset transistor T7 and the source region of the initialization transistor T6 are of an integral structure) of the reset transistor T7 in the active semiconductor layer 0310, on the base substrate 10. In this way, an impact caused by light on the reset transistor T7 can be reduced, and resetting accuracy can be improved. For example, the threshold compensation transistor T3 is a double-gate transistor. For example, the light shielding layer ZG shields an active layer part between two gates of the threshold compensation transistor T3 to play a role of stabilizing a working state of the drive transistor T1 because the threshold compensation transistor T3 is directly connected to the drive transistor T1. For example, in the first direction, a projection of the light shielding layer ZG on the base substrate is within a region where the pixel circuit, in which the light shielding layer is located, located, and is between a projection of a signal line (for example, the data line) on the base substrate and a projection of the first power signal line VDD on the base substrate, to shield signal interference. For example, in the first direction, a projection of the light shielding layer ZG on the base substrate is within the region where the pixel circuit, in which the light shielding layer is located, located, and between a projection of a signal line, for example, the data line, connected to the pixel circuit on the base substrate and a projection of the first power signal line VDD on the base substrate.

For example, as shown in FIG. 3 and FIG. 4C, the orthographic projection of the light shielding layer ZG on the base substrate 10 overlaps an orthographic projection of the drain region of the initialization transistor T6 in the active semiconductor layer 0310 on the base substrate. In this way, an impact caused by light on the initialization transistor T6 can be reduced, and resetting accuracy can be improved.

For example, as shown in FIG. 3 and FIG. 4C, the orthographic projection of the light shielding layer ZG on the base substrate 10 overlaps an orthographic projection of a conducting region of the active layer T3-A of the threshold compensation transistor T3 in the active semiconductor layer 0310 on the base substrate 10. In this way, an impact caused by light on the threshold compensation transistor T3 can be reduced, and threshold compensation accuracy can be improved.

Figure 4D:
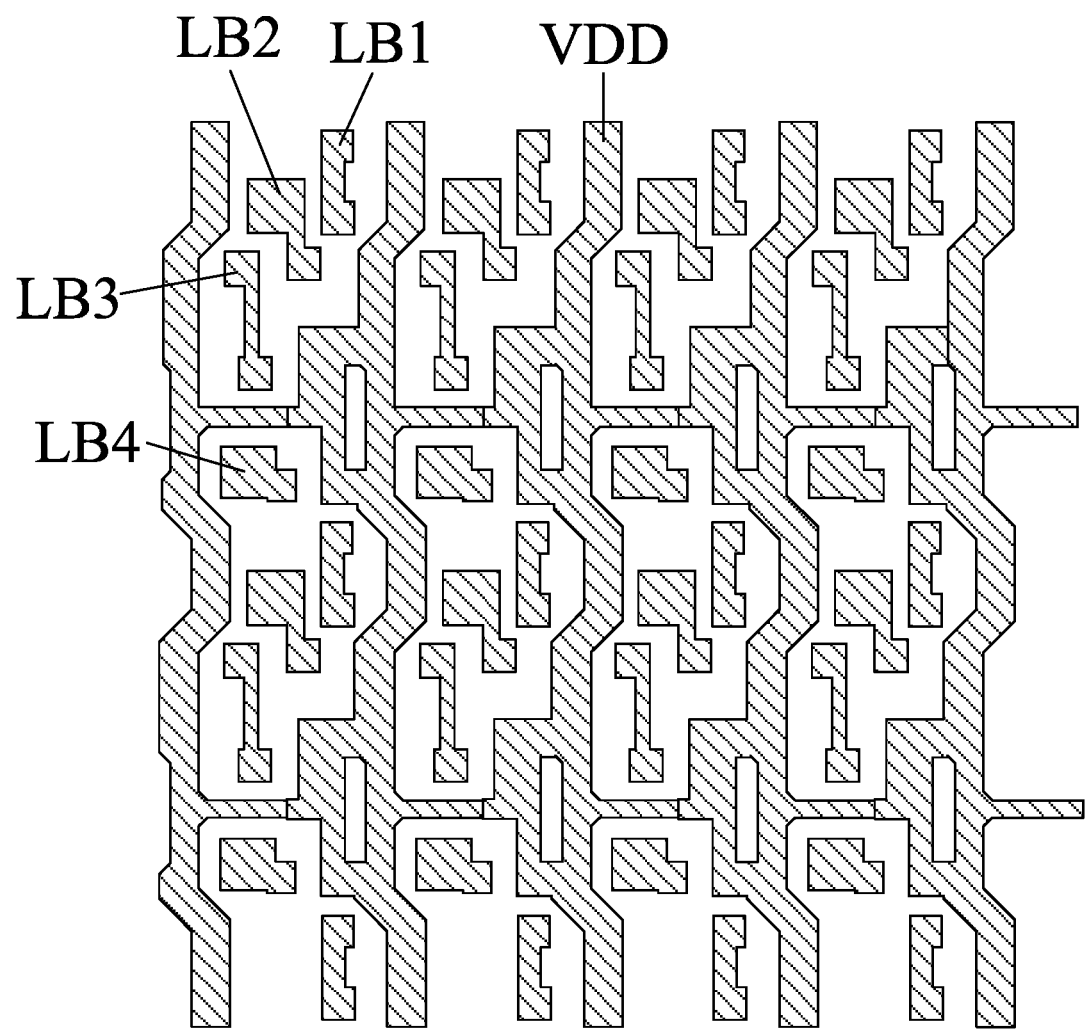
FIG. 4D is a schematic structural diagram of a layout of a source-drain metal layer according to the embodiments of the present disclosure.

For example, a first interlayer insulation layer is formed on the reference conducting layer 0330, to protect the reference conducting layer 0330. FIG. 3 and FIG. 4D show the source-drain metal layer 0340 of the pixel circuit 0121. The source-drain metal layer 0340 may include a first power signal line VDD and connection portions LB1, LB2, LB3, and LB4. For example, the first color subpixel spx1, the second color subpixel spx2, the third color subpixel spx3, and the fourth color subpixel spx4 respectively include the connection portions LB1, LB2, LB3, and LB4.

Figure 4E:
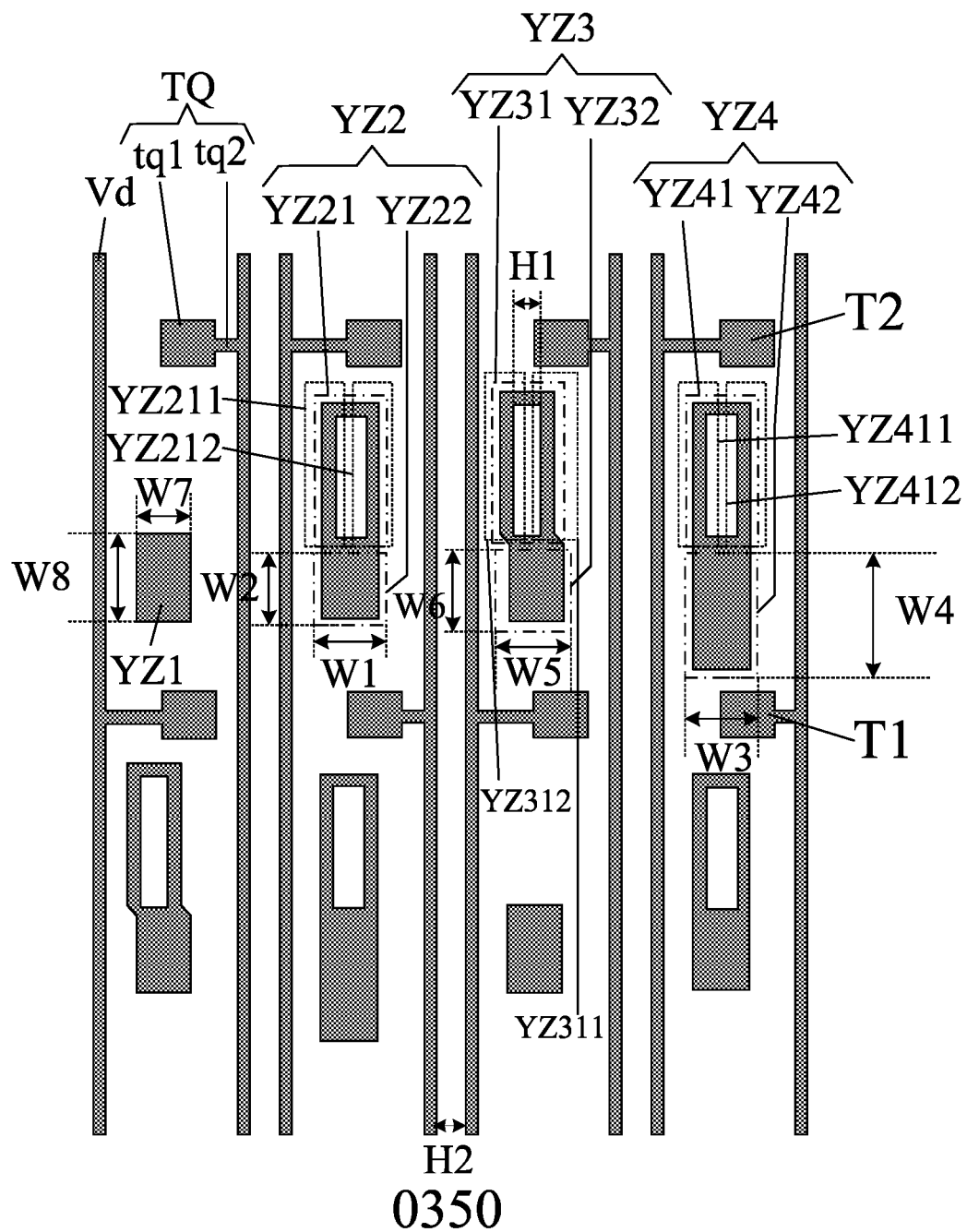
FIG. 4E is a schematic structural diagram of a layout of a first conducting layer according to the embodiments of the present disclosure.

For example, a second interlayer insulation layer is formed on the source-drain metal layer 0340, to protect the source-drain metal layer 0340. FIG. 3 and FIG. 4E show the first conducting layer 0350 of the pixel circuit 0121. The first conducting layer 0350 includes signal lines and anode adapter portions YZ1, YZ2, YZ3, and YZ4 that are disposed at intervals. For example, the first color subpixel spx1 may include the anode adapter portion YZ1, the second color subpixel spx2 may include the anode adapter portion YZ2, the third color subpixel spx3 may include the anode adapter portion YZ3, and the fourth color subpixel spx4 may include the anode adapter portion YZ4.

For example, the multiple signal lines include first signal lines and second signal lines. One column of subpixels corresponds to one first signal line and one second signal line. For example, left and right sides of pixel circuits of subpixels in one column are adjacent to one first signal line and one second signal line, respectively. For example, being adjacent means that in the first direction, there is no other first signal line or second signal line between the pixel circuit and the first signal line adjacent to it or between the pixel circuit and the second signal line adjacent to it. A signal protrusion portion of the first signal line is electrically connected to subpixels in an odd-numbered row, and a signal protrusion portion of the second signal line is electrically connected to subpixels in an even-numbered row. For example, the signal line may be configured as a data line VD used to transmit the data signal. In some embodiments, the data line VD has a signal protrusion portion TQ. The data lines VD extend in the second direction F2, and are arranged in the first direction F1. In some embodiments, one column of subpixels corresponds to two data lines. For example, left and right sides of pixels circuits of subpixels in one column are respectively adjacent to one first signal line and one second signal line. A signal protrusion portion of one of the two data lines is electrically connected to pixel circuits of subpixels in an odd-numbered row, and a signal protrusion portion of the other data line is electrically connected to pixel circuits of subpixels in an even-numbered row.

It should be noted that one first signal line and one second signal line that correspond to one column of subpixels may refer to signal lines (for example, data lines) directly adjacent to the pixel circuits of the subpixels in this column. Being directly adjacent means that there is no other signal line between the signal line and this column of the pixel circuits. For example, being directly adjacent means that there is no other data line between the data line and this column of the pixel circuits.

For example, in two first signal lines and two second signal lines that correspond to adjacent two columns of subpixels, the two first signal lines that are adjacent may form a first signal line group. For example, two adjacent first signal lines electrically connected to subpixels in odd-numbered rows may form a first signal line group. It should be noted that there is no other corresponding signal line between the two first signal lines in the first signal line group. For example, no other data line is between two adjacent data lines.

For example, in two first signal lines and two second signal lines that correspond to adjacent two columns of subpixels, the two second signal lines that are adjacent may form a second signal line group. For example, two adjacent second signal lines electrically connected to subpixels in even-numbered rows may form a second signal line group. It should be noted that there is no other corresponding signal line between the two second signal lines in the second signal line group. For example, no other data line is between two adjacent data lines.

Figure 5:
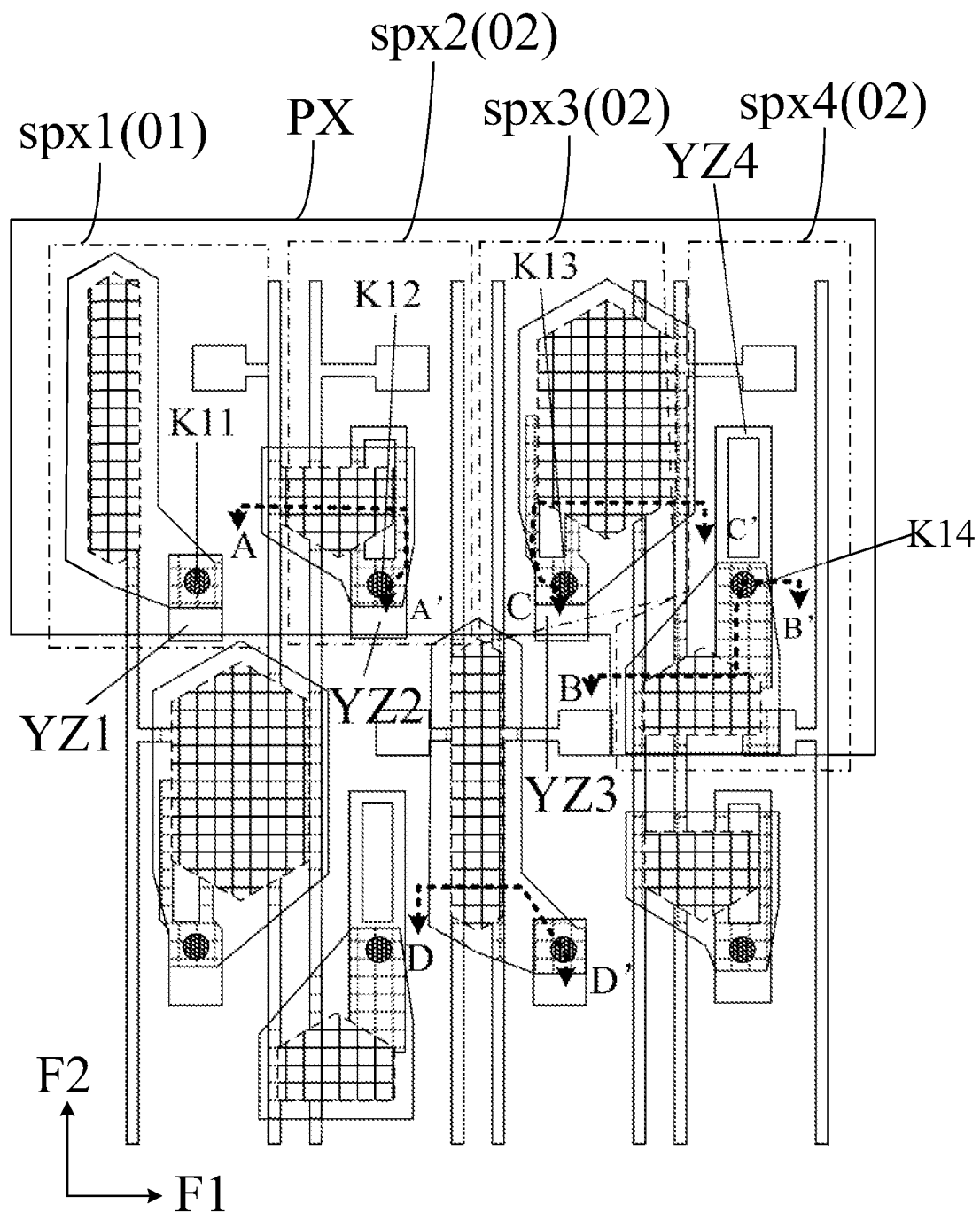
FIG. 5 is a schematic structural diagram of a layout of some other display substrates according to the embodiments of the present disclosure.
Figure 6A:
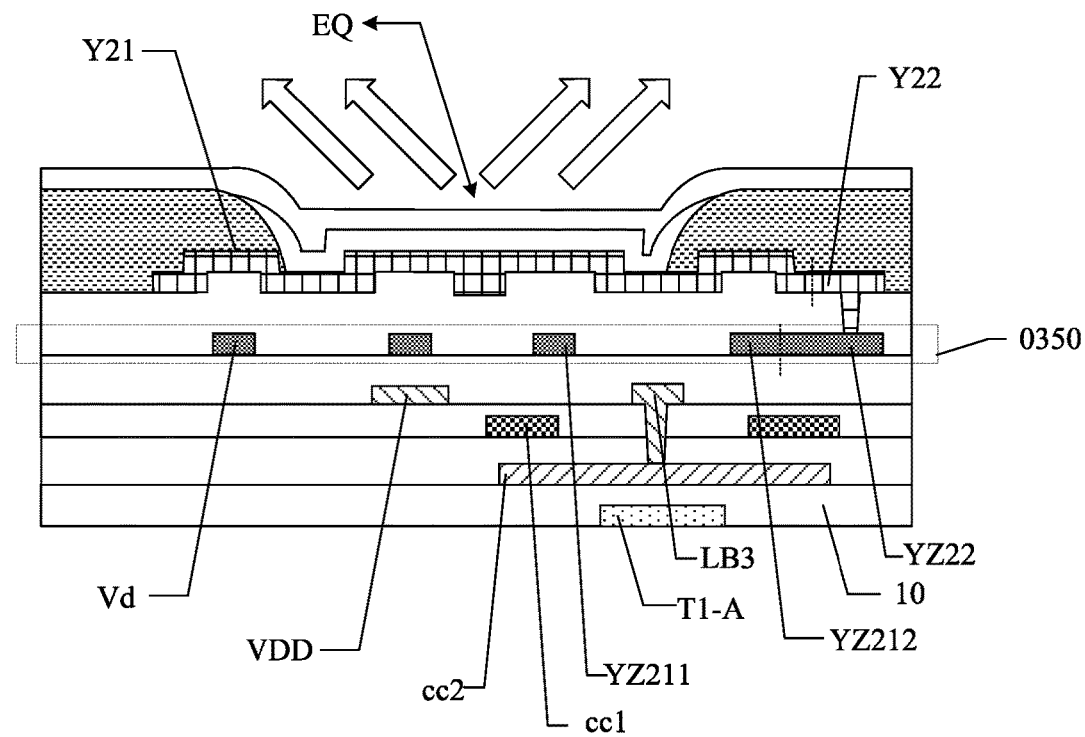
FIG. 6A is a schematic sectional structural diagram in an AA' direction of the schematic structural diagram of the layout shown in FIG. 5.
Figure 6B:
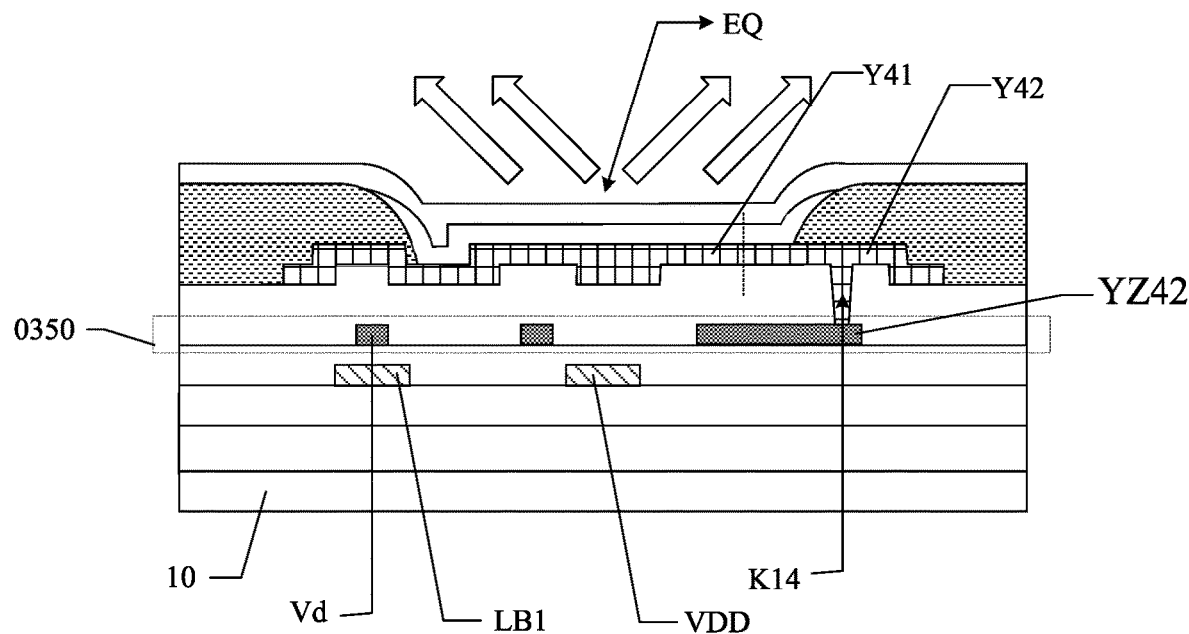
FIG. 6B is a schematic sectional structural diagram in a BB' direction of the schematic structural diagram of the layout shown in FIG. 5.
Figure 6C:
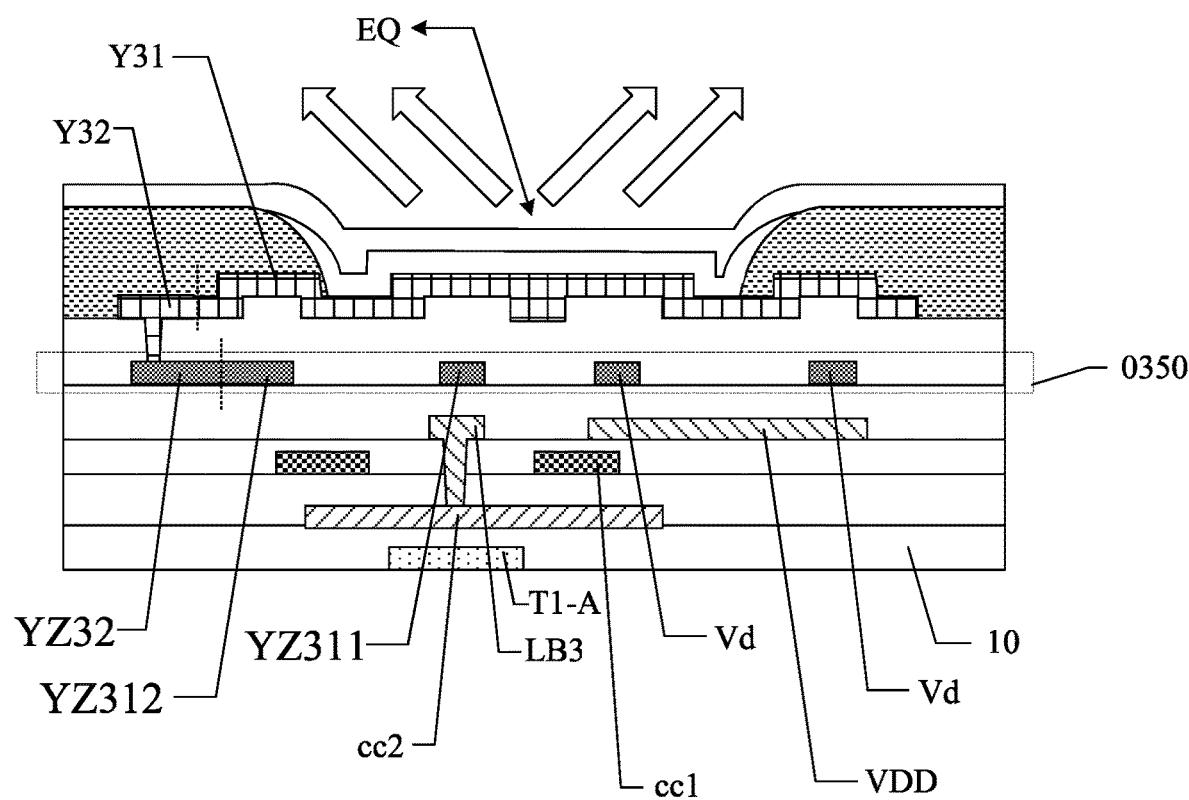
FIG. 6C is a schematic sectional structural diagram in a CC' direction of the schematic structural diagram of the layout shown in FIG. 5.
Figure 6D:
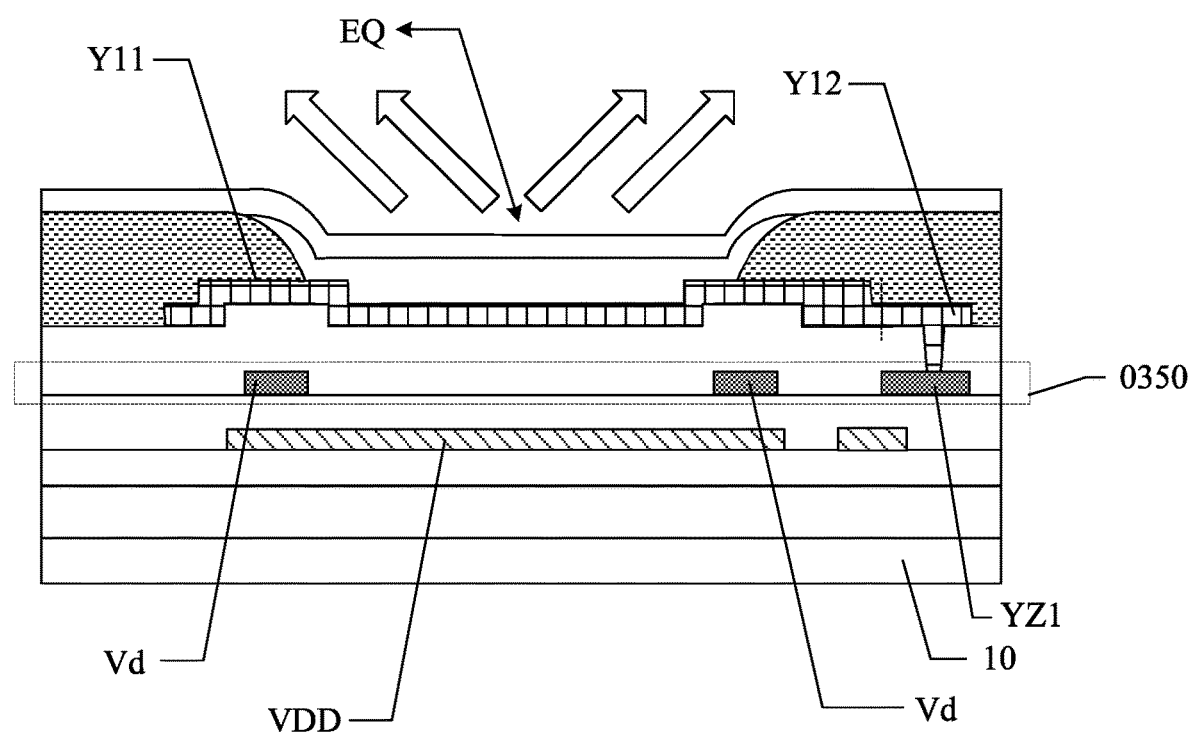
FIG. 6D is a schematic sectional structural diagram in a DD' direction of the schematic structural diagram of the layout shown in FIG. 5.

For example, as shown in FIG. 5, repetition units that are adjacent in the second direction F2 are arranged in a staggered manner. In this way, a second color subpixel spx2 in one of the two repetition units that are adjacent to each other in the second direction F2 is adjacent to a fourth color subpixel spx4 in the other repetition unit in the second direction F2. For example, the second color subpixel spx2 in one of the two repetition units that are adjacent to each other and the fourth color subpixel spx4 in the other repetition unit in the second direction F2 are located in a same column in the second direction F2, to form one subpixel pair, for example, are aligned in a column direction. For example, a first color subpixel spx1, a subpixel pair including a second color subpixel spx2 and a fourth color subpixel spx4, and a third color subpixel spx3 are sequentially arranged in the first direction F1. For example, the second color subpixel spx2 and the fourth color subpixel spx4 respective in the respective repetition units that are adjacent to each other in the second direction F2 are used to display a same color, and light-emitting layers thereof are integrally formed. For example, areas of light-emitting regions of the second color subpixel spx2 and the fourth color subpixel spx4 respective in the respective repetition units that are adjacent in the second direction F2 are the same. For example, the light-emitting regions of the second color subpixel spx2 and the fourth color subpixel spx4 respective in the respective repetition units that are adjacent in the second direction F2 are approximately two rounded-corners-polygon-shaped regions or round-shaped regions that are longitudinally symmetrical, for example, rounded-corners-pentagon-shaped regions. For example, a light-emitting region of the first color subpixel spx1 is approximately a rounded-corners-polygon-shaped region or an oval-shaped region, for example, a rounded-corners-hexagon-shaped region. For example, a light-emitting region of the third color subpixel spx3 is approximately a rounded-corners-polygon-shaped region or an oval-shaped region, for example, a rounded-corners-hexagon-shaped region. For example, a size of the light-emitting region of the first color subpixel spx1 in the second direction F2 is greater than a size of the light-emitting region of each of the second color subpixel spx2, the third color subpixel spx3, and the fourth color subpixel spx4 in the second direction F2. For example, the size of the light-emitting region of the third color subpixel spx3 in the second direction F2 is greater than the size of the light-emitting region of each of the second color subpixel spx2 and the fourth color subpixel spx4 in the second direction F2. For example, a size of the light-emitting region of the third color subpixel spx3 in the first direction F1 is greater than a size of each of the second color subpixel spx2, the fourth color subpixel spx4, and the first color subpixel spx1 in the first direction F1. For example, the size of the light-emitting region of the first color subpixel spx1 in the first direction F1 is less than the size of the light-emitting region of each of the second color subpixel spx2 and the fourth color subpixel spx4 in the first direction F1.

Figure 4F:
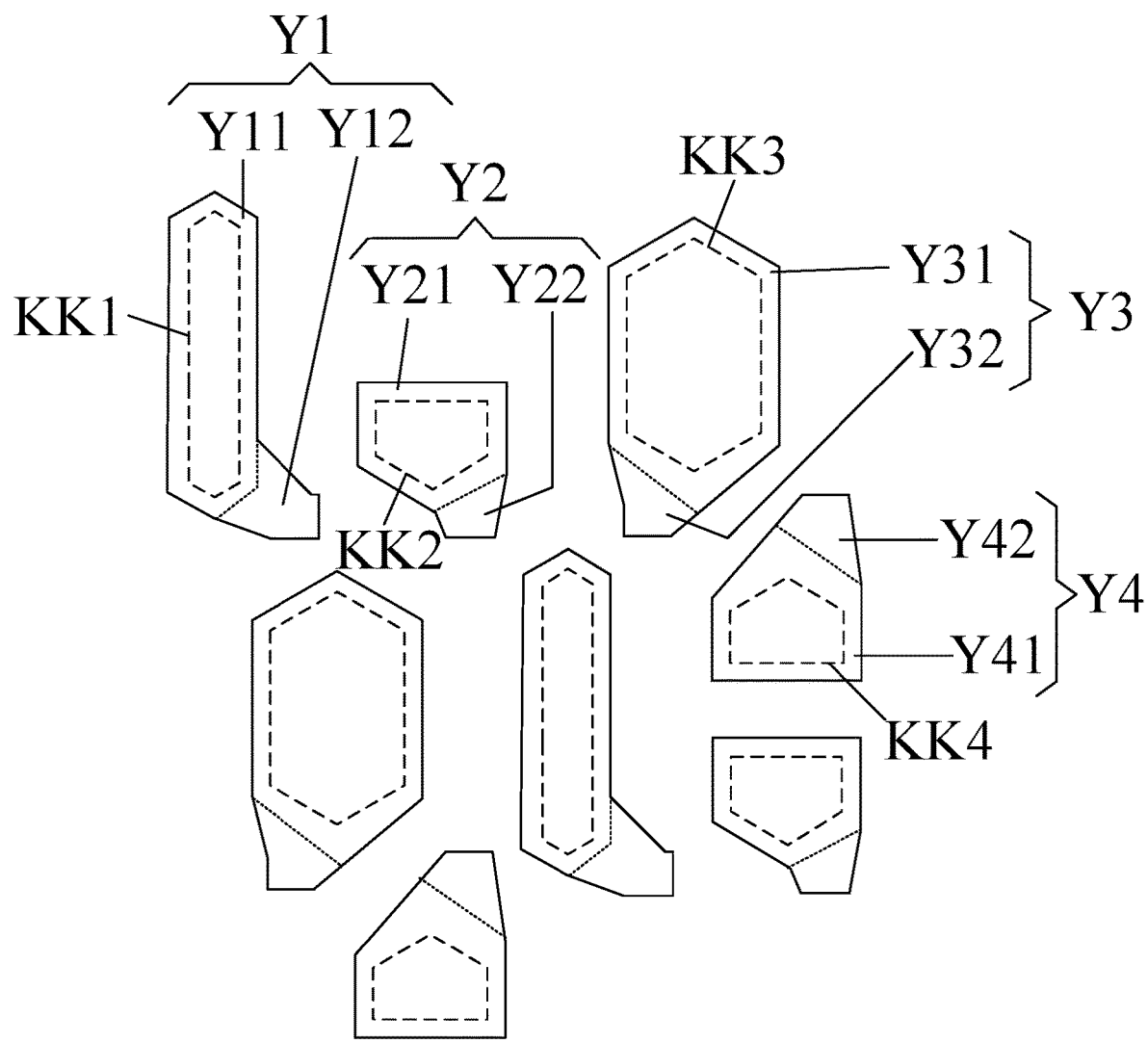
FIG. 4F is a schematic structural diagram of a layout of an anode layer according to the embodiments of the present disclosure.

For example, the first insulation layer is formed on the first conducting layer 0350, to protect the first conducting layer 0350. FIG. 3 and FIG. 4F show an anode layer 0360 on a side of the first conducting layer 0350 away from the base substrate 10, and the anode layer 0360 includes anodes Y1, Y2, Y3, and Y4. For example, the first color subpixel spx1 may include the anode Y1, the second color subpixel spx2 may include the anode Y2, the third color subpixel spx3 may include the anode Y3, and the fourth color subpixel spx4 may include the anode Y4.

As shown in FIG. 3 to FIG. 4F, the first power signal line VDD is electrically connected to the source region of the corresponding first light-emitting control transistor T4 in the active semiconductor layer 0310 by at least one via hole penetrating through the gate insulation layer, the interlayer dielectric layer, and the first interlayer insulation layer. The first power signal line VDD is electrically connected to the first electrode cc1 of the storage capacitor CST in the reference conducting layer 0330 by at least one via hole penetrating through the first interlayer insulation layer. The first power signal line VDD is further electrically connected to the light shielding layer ZG by at least one via hole penetrating through the first interlayer insulation layer. In addition, the first power signal line VDD is electrically connected to the light shielding layer ZG in the reference conducting layer 0330 by at least one via hole penetrating through the first interlayer insulation layer.

As shown in FIG. 3 to FIG. 4F, one end of the connection portion LB1 is electrically connected to the drain region of the corresponding threshold compensation transistor T3 in the active semiconductor layer 0310 by at least one via hole penetrating through the gate insulation layer, the interlayer dielectric layer, and the first interlayer insulation layer. The other end of the connection portion LB1 is electrically connected to the initialization line VINIT by at least one via hole penetrating through the first interlayer insulation layer.

As shown in FIG. 3 to FIG. 4F, one end of the connection portion LB2 is electrically connected to the signal protrusion portion TQ of the data line by a via hole penetrating through the second interlayer insulation layer, and the other end of the connection portion LB2 is electrically connected to the source region of the data write transistor T2 in the active semiconductor layer 0310 by at least one via hole penetrating through the gate insulation layer, the interlayer dielectric layer, and the first interlayer insulation layer.

As shown in FIG. 3 to FIG. 4F, one end of the connection portion LB3 is electrically connected to the second electrode cc2 (namely, the drive gate of the drive transistor T1) of the storage capacitor CST by at least one drive via hole GKO penetrating through the interlayer dielectric layer and the first interlayer insulation layer. The other end of the connection portion LB3 is electrically connected to the drain region of the initialization transistor T6 in the active semiconductor layer 0310 by at least one via hole penetrating through the gate insulation layer, the interlayer dielectric layer, and the first interlayer insulation layer. In other words, that the drive gate of the drive transistor is electrically connected to the active semiconductor layer through the drive via hole may mean that the drive gate of the drive transistor T1 is electrically connected to one end of the connection portion LB3 through the drive via hole GKO, and the other end of the connection portion LB3 is electrically connected to the drain region of the initialization transistor T6 in the active semiconductor layer 0310 by the at least one via hole penetrating through the gate insulation layer, the interlayer dielectric layer, and the first interlayer insulation layer. In addition, as shown in FIG. 3 to FIG. 4F, in the subpixel, an orthographic projection of at least a part of the drive via hole GKO on the base substrate does not overlap orthographic projections of the anode adapter portion and the signal lines on the base substrate.

As shown in FIG. 3 to FIG. 4F, the connection portion LB4 is electrically connected to the drain region of the second light-emitting control transistor T5 in the active semiconductor layer 0310 by at least one via hole penetrating through the gate insulation layer, the interlayer dielectric layer, and the first interlayer insulation layer.

In some examples, as shown in FIG. 3 to FIG. 4F, the first insulation layer includes first via holes, each first via hole exposes a part of a corresponding anode adapter portion, and the anode includes a main body portion and an auxiliary portion that are electrically connected. The auxiliary portion is electrically connected to the anode adapter portion through the first via hole. For example, in the first color subpixel spx1, the anode Y1 includes a main body portion Y11 and an auxiliary portion Y12 that are electrically connected, the auxiliary portion Y12 is electrically connected to the anode adapter portion YZ1 through a first via hole K11, and the anode adapter portion YZ1 is electrically connected to the connection portion LB4 by a via hole penetrating through the second interlayer insulation layer. In the second color subpixel spx2, the anode Y2 includes a main body portion Y21 and an auxiliary portion Y22 that are electrically connected, the auxiliary portion Y22 is electrically connected to the anode adapter portion YZ2 through a first via hole K12, and the anode adapter portion YZ2 is electrically connected to the connection portion LB4 by a via hole penetrating through the second interlayer insulation layer. In the third color subpixel spx3, the anode Y3 includes a main body portion Y31 and an auxiliary portion Y32 that are electrically connected, the auxiliary portion Y32 is electrically connected to the anode adapter portion YZ3 through a first via hole K13, and the anode adapter portion YZ3 is electrically connected to the connection portion LB4. In the fourth color subpixel spx4 by a via hole penetrating through the second interlayer insulation layer, the anode Y4 includes a main body portion Y41 and an auxiliary portion Y42 that are electrically connected, the auxiliary portion Y42 is electrically connected to the anode adapter portion YZ4 through a first via hole K14, and the anode adapter portion YZ4 is electrically connected to the connection portion LB4 by a via hole penetrating through the second interlayer insulation layer.

It should be noted that the main body portion and the auxiliary portion that are included in the anode and that are electrically connected are of an integral structure. In other words, the main body portion and the auxiliary portion are continuously formed.

In some examples, as shown in FIG. 3 to FIG. 5, the multiple subpixels include first subpixels 01 and second subpixels 02. In the first subpixel 01, an orthographic projection of an anode adapter portion on the base substrate 10 does not overlap an orthographic projection of a drive active layer on the base substrate 10, and an orthographic projection of a main body portion on the base substrate 10 does not overlap the orthographic projection of the anode adapter portion on the base substrate 10. In the second subpixel 02, an orthographic projection of an anode adapter portion on the base substrate 10 overlaps an orthographic projection of a drive active layer on the base substrate 10, and an orthographic projection of a main body portion on the base substrate 10 overlaps the orthographic projection of the anode adapter portion on the base substrate 10. In this way, main body portions and anode adapter portions of anodes in some subpixels overlap, so that flatness of the main body portion of the anode can be adjusted by using the anode adapter portion, to avoid occurrence of an uneven anode caused by the first conducting layer, and reduce a color cast phenomenon of the display substrate.

In some examples, a pixel define layer is further disposed on a side of the anode layer away from the base substrate, a light-emitting layer is further disposed on a side of the pixel define layer away from the base substrate, and a cathode layer is further disposed on a side of the light-emitting layer away from the base substrate. In this way, the anode, the light-emitting layer, and the cathode may form a light-emitting element. For example, with reference to FIG. 4F to FIG. 6C, the pixel define layer may include multiple opening regions (for example, KK1, KK2, KK3, and KK4). One anode corresponds to one opening region, and an orthographic projection of the opening region on the base substrate 10 is located in an orthographic projection of a main body portion of the corresponding anode on the base substrate 10. For example, in the first color subpixel, the opening region KK1 corresponds to the main body portion Y11 of the anode Y1. In the second color subpixel, the opening region KK2 corresponds to the main body portion Y21 of the anode Y2. In the third color subpixel, the opening region KK3 corresponds to the main body portion Y31 of the anode Y3. In the fourth color subpixel, the opening region KK4 corresponds to the main body portion Y41 of the anode Y4. In some examples, in the second subpixel, an orthographic projection of an opening region corresponding to an anode on the base substrate overlaps the orthographic projection of the anode adapter portion on the base substrate. In the first subpixel, an orthographic projection of an opening region corresponding to an anode on the base substrate does not overlap the orthographic projection of the anode adapter portion on the base substrate. For example, a light-emitting region of each subpixel corresponds to each opening region. For example, a light-emitting region of the first color subpixel is the opening region corresponding to the anode thereof, a light-emitting region of the second color subpixel is the opening region corresponding to the anode thereof, a light-emitting region of the third color subpixel is the opening region corresponding to the anode thereof, and a light-emitting region of the fourth color subpixel is the opening region corresponding to the anode thereof.

In some examples, as shown in FIG. 3 to FIG. 5 and FIG. 6D, the first subpixel 01 includes the first color subpixel spx1. In other words, in the first color subpixel spx1, an orthographic projection of the anode adapter portion YZ1 on the base substrate 10 does not overlap an orthographic projection of a drive active layer T1-A on the base substrate 10, and an orthographic projection of the main body portion Y11 on the base substrate 10 does not overlap the orthographic projection of the anode adapter portion YZ1 on the base substrate 10. Further, the orthographic projection of the anode adapter portion YZ1 on the base substrate 10 does not overlap an orthographic projection of the opening region KK1 on the base substrate 10.

Further, in the first color subpixel spx1, the orthographic projection of the anode adapter portion YZ1 on the base substrate 10 overlaps an edge of an orthographic projection of the first electrode cc1 of the storage capacitor CST on the base substrate 10, and the orthographic projection of the anode adapter portion YZ1 on the base substrate 10 does not overlap an orthographic projection of the second electrode cc2 of the storage capacitor CST on the base substrate 10.

In some examples, as shown in FIG. 3 to FIG. 5, in the first color subpixel spx1, the orthographic projection of the main body portion Y11 on the base substrate 10 overlaps orthographic projections of two signal lines (for example, the following first signal line group (for example, two data lines VD) or second signal line group (for example, two data lines VD)) on the base substrate 10, and the orthographic projections of the main body portion Y11 on the base substrate 10 does not overlap the orthogonal projections of the anode adapter portion YZ1 and the signal protrusion portion on the substrate 10. In some embodiments, in the first color subpixel spx1, the two signal lines (for example, the following first signal line group (for example, two data lines VD) or second signal line group (for example, two data lines VD)) the orthographic projection of which on the base substrate overlaps the orthographic projection of the main body portion Y11 on the base substrate 10 are respectively on two sides of a center of the main body portion Y11. For example, the main body portion Y11 in the first color subpixel spx1 has a first main body symmetrical axis in the second direction F2. In the first color subpixel spx1, in the second direction F2, the two signal lines (for example, the following first signal line group (for example, two data lines VD) or second signal line group (for example, two data lines VD)) the orthographic projection of which on the base substrate overlaps the orthographic projection of the main body portion Y11 on the base substrate 10 are respectively located on two opposite sides of the first main body symmetrical axis. Further, in the first color subpixel spx1, in the first direction F1, a ratio between distances between the two signal lines (for example, the following first signal line group (for example, two data lines VD) or second signal line group (for example, two data lines VD)) the orthographic projection of which on the base substrate overlaps the orthographic projection of the main body portion Y11 on the base substrate 10 and the first main body symmetrical axis ranges from 0.8 to 1.2. For example, in the first direction F1, the ratio between the distances between the two signal lines (for example, the following first signal line group (for example, two data lines VD) or second signal line group (for example, two data lines VD)) the orthographic projection of which on the base substrate overlaps the orthographic projection of the main body portion Y11 on the base substrate 10 and the first main body symmetrical axis is 0.8, 1.0, 1.1, or 1.2. Further, in the first color subpixel spx1, projections of the main body portion Y11 and the signal protrusion portion TQ connected to the same pixel circuit does not overlap with each other.

In some examples, as shown in FIG. 3 to FIG. 5, the second subpixel 02 may include at least one of the second color subpixel spx2, the third color subpixel spx3, and the fourth color subpixel spx4. For example, when the second subpixel 02 includes the second color subpixel spx2, in the second color subpixel spx2, an orthographic projection of the anode adapter portion YZ2 on the base substrate 10 overlaps an orthographic projection of the drive active layer T1-A on the base substrate 10, and an orthographic projection of the main body portion Y21 on the base substrate 10 overlaps an orthographic projection of the anode adapter portion YZ2 on the base substrate 10. Further, an orthographic projection of the opening region KK2 on the base substrate 10 overlaps the orthographic projection of the anode adapter portion YZ2 on the base substrate 10. Further, in the second color subpixel spx2, the main body portion Y21 does not overlap a signal protrusion portion TQ connected to the same pixel circuit.

Further, in the second color subpixel spx2, the orthographic projection of the anode adapter portion YZ2 on the base substrate 10 overlaps an orthographic projection of the first electrode cc1 of the storage capacitor CST on the base substrate 10, and the orthographic projection of the anode adapter portion YZ2 on the base substrate 10 also overlaps an orthographic projection of the second electrode cc2 of the storage capacitor CST on the base substrate 10. Further, in the second direction, the orthographic projection of the anode adapter portion YZ2 on the base substrate 10 runs through the orthographic projection of the first electrode cc1 of the storage capacitor CST on the base substrate 10, and in the second direction, the orthographic projection of the anode adapter portion YZ2 on the base substrate 10 also runs through the orthographic projection of the second electrode cc2 of the storage capacitor CST on the base substrate 10.

For example, when the second subpixel 02 includes the third color subpixel spx3, in the third color subpixel spx3, an orthographic projection of the anode adapter portion YZ3 on the base substrate 10 overlaps an orthographic projection of a drive active layer T1-A on the base substrate 10, and an orthographic projection of the main body portion Y31 on the base substrate 10 overlaps the orthographic projection of the anode adapter portion YZ3 on the base substrate 10. Further, an orthographic projection of the opening region KK3 on the base substrate 10 overlaps the orthographic projection of the anode adapter portion YZ3 on the base substrate 10. Further, in the third color subpixel spx3, the main body portion Y31 overlaps a signal protrusion portion TQ connected to the same pixel circuit.

Further, in the third color subpixel spx3, the orthographic projection of the anode adapter portion YZ3 on the base substrate 10 overlaps an orthographic projection of a first electrode cc1 of a storage capacitor CST on the base substrate 10, and the orthographic projection of the anode adapter portion YZ3 on the base substrate 10 also overlaps an orthographic projection of a second electrode cc2 of the storage capacitor CST on the base substrate 10. Further, in the second direction, the orthographic projection of the anode adapter portion YZ3 on the base substrate 10 runs through the orthographic projection of the first electrode cc1 of the storage capacitor CST on the base substrate 10, and in the second direction, the orthographic projection of the anode adapter portion YZ3 on the base substrate 10 also runs through the orthographic projection of the second electrode cc2 of the storage capacitor CST on the base substrate 10.

For example, when the second subpixel 02 includes the fourth color subpixel spx4, in the fourth color subpixel spx4, an orthographic projection of the anode adapter portion YZ4 on the base substrate 10 overlaps an orthographic projection of a drive active layer T1-A on the base substrate 10, and an orthographic projection of the main body portion Y41 on the base substrate 10 overlaps the orthographic projection of the anode adapter portion YZ4 on the base substrate 10. Further, an orthographic projection of the opening region KK4 on the base substrate 10 overlaps the orthographic projection of the anode adapter portion YZ4 on the base substrate 10. Further, in the fourth color subpixel spx4, the main body portion Y41 does not overlap a signal protrusion portion TQ connected to the same pixel circuit. The main body portion Y41 in the fourth color subpixel spx4 overlaps a signal protrusion portion TQ in a pixel circuit connected to an adjacent second color subpixel spx2.

Further, in the fourth color subpixel spx4, the orthographic projection of the anode adapter portion YZ4 on the base substrate 10 overlaps an orthographic projection of a first electrode cc1 of a storage capacitor CST on the base substrate 10, and the orthographic projection of the anode adapter portion YZ4 on the base substrate 10 also overlaps an orthographic projection of a second electrode cc2 of the storage capacitor CST on the base substrate 10. Further, in the second direction, the orthographic projection of the anode adapter portion YZ4 on the base substrate 10 runs through the orthographic projection of the first electrode cc1 of the storage capacitor CST on the base substrate 10, and in the second direction, the orthographic projection of the anode adapter portion YZ4 on the base substrate 10 also runs through the orthographic projection of the second electrode cc2 of the storage capacitor CST on the base substrate 10.

In some examples, as shown in FIG. 3 to FIG. 5, the anode adapter portion (namely, the anode adapter portion overlapping the orthographic projection of the main body portion on the base substrate 10) in the second subpixel 02 may include a first sub anode adapter portion and a second sub anode adapter portion that are electrically connected. The first sub anode adapter portion has a hollow-out structure, the second sub anode adapter portion has a solid structure, and the auxiliary portion is electrically connected to the second sub anode adapter portion through the first via hole. In addition, in the second subpixel 02, an orthographic projection of the first sub anode adapter portion on the base substrate 10 overlaps the orthographic projection of the drive active layer on the base substrate 10. It should be noted that the solid structure means that the orthographic projection of the second sub anode adapter portion on the base substrate has an entire surface, and does not include a hollow-out structure.

For example, as shown in FIG. 3 to FIG. 5, in the second color subpixel spx2, the anode adapter portion YZ2 may include a first sub anode adapter portion YZ21 and a second sub anode adapter portion YZ22 that are electrically connected. The first sub anode adapter portion YZ21 has a hollow-out structure, the second sub anode adapter portion YZ22 has a solid structure, and the auxiliary portion Y22 is electrically connected to the second sub anode adapter portion YZ22 through the first via hole K12. In addition, an orthographic projection of the first sub anode adapter portion YZ21 on the base substrate 10 overlaps the orthographic projection of the drive active layer T1-A on the base substrate 10.

For example, as shown in FIG. 3 to FIG. 5, in the third color subpixel spx3, the anode adapter portion YZ3 may include a first sub anode adapter portion YZ31 and a second sub anode adapter portion YZ32 that are electrically connected. The first sub anode adapter portion YZ31 has a hollow-out structure, the second sub anode adapter portion YZ32 has a solid structure, and the auxiliary portion Y32 is electrically connected to the second sub anode adapter portion YZ32 through the first via hole K13. In addition, an orthographic projection of the first sub anode adapter portion YZ31 on the base substrate 10 overlaps the orthographic projection of the drive active layer T1-A on the base substrate 10.

For example, as shown in FIG. 3 to FIG. 5, in the fourth color subpixel spx4, the anode adapter portion YZ4 may include a first sub anode adapter portion YZ41 and a second sub anode adapter portion YZ42 that are electrically connected. The first sub anode adapter portion YZ41 has a hollow-out structure, the second sub anode adapter portion YZ42 has a solid structure, and the auxiliary portion Y42 is electrically connected to the second sub anode adapter portion YZ42 through the first via hole K14. In addition, an orthographic projection of the first sub anode adapter portion YZ41 on the base substrate 10 overlaps the orthographic projection of the drive active layer T1-A on the base substrate 10.

For example, as shown in FIG. 3 to FIG. 5, in the second direction F2, in a same subpixel, an orthographic projection of the scanning line on the base substrate 10 is on a side of an orthographic projection of the drive active layer on the base substrate 10 away from an orthographic projection of the second sub anode adapter portion on the base substrate 10. In addition, in the second subpixel 02, the orthographic projection of the first sub anode adapter portion on the base substrate 10 overlaps an orthographic projection of the scanning line on the base substrate 10. For example, as shown in FIG. 3 to FIG. 5, in the second color subpixel spx2, the orthographic projection of the first sub anode adapter portion YZ21 on the base substrate 10 overlaps an orthographic projection of the scanning line GA on the base substrate 10.

For example, as shown in FIG. 3 to FIG. 5, in the third color subpixel spx3, the orthographic projection of the first sub anode adapter portion YZ31 on the base substrate 10 overlaps an orthographic projection of the scanning line GA on the base substrate 10. For example, at least a part of the orthographic projection of the first sub anode adapter portion YZ31 on the base substrate 10 is covered by an orthographic projection of the anode Y3 on the base substrate 10. Further, the orthographic projection of the first sub anode adapter portion YZ31 on the base substrate 10 is covered by the orthographic projection of the anode Y3 on the base substrate 10.

For example, as shown in FIG. 3 to FIG. 5, in the fourth color subpixel spx4, the orthographic projection of the first sub anode adapter portion YZ41 on the base substrate 10 overlaps an orthographic projection of the scanning line GA on the base substrate 10.

For example, an orthographic projection of the anode Y4 in the fourth color subpixel spx4 on the base substrate 10 covers the orthographic projection of a part of the anode adapter portion YZ4 on the base substrate 10. An orthographic projection of the anode Y2 in the second color subpixel spx2 on the base substrate 10 covers the orthographic projection of a part of the anode adapter portion YZ2 on the base substrate 10. In addition, in a same repetition unit, an area of the part, covered by the anode Y2, of the anode adapter portion YZ2 in the second color subpixel spx2 is greater than an area of the part, covered by the anode Y4, of the anode adapter portion YZ4 in the fourth color subpixel spx4.

In some examples, as shown in FIG. 3 to FIG. 5, in the second subpixel 02, an orthographic projection of a hollow-out region LQ of the hollow-out structure of the first sub anode adapter portion on the base substrate 10 overlaps an orthographic projection of the via hole GKO, connected to the drive gate, on the base substrate 10. For example, an orthographic projection of the hollow-out structure of the first sub anode adapter portion on the base substrate 10 overlaps a hollow-out region LQ of the first electrode cc1 of the storage capacitor CST. The hollow-out region LQ is used as a via hole through which the drive gate (namely, the second electrode cc2 of the storage capacitor CST) and another transistor are connected, e.g., an electrode (the source or the drain) of the threshold compensation transistor and the drive gate (namely, the second electrode cc2 of the storage capacitor CST) are connected by using the connection portion LB3 in the source-drain metal layer. For example, as shown in FIG. 3 to FIG. 5, in the second color subpixel spx2, an orthographic projection of the hollow-out structure of the first sub anode adapter portion YZ21 on the base substrate 10 overlaps an orthographic projection of a center region of the drive gate on the base substrate 10. In addition, the orthographic projection of the hollow-out structure of the first sub anode adapter portion YZ21 on the base substrate 10 overlaps a hollow-out region of the first electrode cc1 of the storage capacitor CST. In the third color subpixel spx3, an orthographic projection of the hollow-out structure of the first sub anode adapter portion YZ31 on the base substrate 10 overlaps an orthographic projection of a center region of the drive gate on the base substrate 10. In addition, the orthographic projection of the hollow-out structure of the first sub anode adapter portion YZ21 on the base substrate 10 overlaps a hollow-out region of the first electrode cc1 of the storage capacitor CST. In the fourth color subpixel spx4, an orthographic projection of the hollow-out structure of the first sub anode adapter portion YZ41 on the base substrate 10 overlaps an orthographic projection of a center region of the drive gate on the base substrate 10. In addition, the orthographic projection of the hollow-out structure of the first sub anode adapter portion YZ21 on the base substrate 10 overlaps a hollow-out region of the first electrode cc1 of the storage capacitor CST.

In some examples, as shown in FIG. 3 to FIG. 5, in the second subpixel 02, the orthographic projection of the main body portion Y21 on the base substrate 10 overlaps orthographic projections of two signal lines (for example, the following first signal line group (for example, two data lines VD) or second signal line group (for example, two data lines VD)) on the base substrate 10. For example, as shown in FIG. 3 to FIG. 5, in the second color subpixel spx2, the orthographic projection of the main body portion Y21 on the base substrate 10 overlaps orthographic projections of two signal lines (for example, two data lines VD) on the base substrate 10. In the third color subpixel spx3, the orthographic projection of the main body portion Y31 on the base substrate 10 overlaps orthographic projections of two signal lines (for example, two data lines VD) on the base substrate 10. In the fourth color subpixel spx4, the orthographic projection of the main body portion Y41 on the base substrate 10 overlaps orthographic projections of two signal lines (for example, two data lines VD) on the base substrate 10.

In some examples, as shown in FIG. 3 to FIG. 5, the first sub anode adapter portion has a first sub adapter portion and a second sub adapter portion that are disposed oppositely. In the first direction, an orthographic projection of the firs sub adapter portion on the base substrate 10 is between an orthographic projection of the second sub adapter portion on the base substrate 10 and orthographic projections of two signal lines on the base substrate 10. For example, the first sub adapter portion may approximately extend in the second direction F2, and the second sub adapter portion may also approximately extend in the second direction F2.

For example, as shown in FIG. 3 to FIG. 5, in the second color subpixel spx2, the first sub anode adapter portion YZ21 has a first sub adapter portion YZ211 and a second sub adapter portion YZ212 that are disposed oppositely. An orthographic projection of the first sub adapter portion YZ211 on the base substrate 10 is between an orthogonal projection of the second sub adapter portion YZ212 on the base substrate 10 and orthographic projections, which overlaps the orthogonal projection of the main body portion Y21 in the second color subpixel spx2 on the base substrate, of the two signal lines (for example, two data lines VD), on the base substrate 10. For example, the first sub adapter portion YZ211 is closer to a center of the main body portion Y21 than the second sub adapter portion YZ212. For example, the orthographic projection of the second sub adapter portion YZ212 on the base substrate 10 overlaps an edge of the orthographic projection of the main body portion Y21 on the base substrate 10. For example, in the first direction F1, a part where projections of the first sub adapter portion YZ211 and the second sub adapter portion YZ212 overlap with the main body portion Y21 is on a same side of a center of the projection of the main body portion Y21. For example, in the first direction F1, a part where projections of the first sub adapter portion YZ211 and the second sub adapter portion YZ212 overlap with the main body portion Y21 is on a first side of the center of the projection of the main body portion Y21, the projections of the two signal lines (for example, two data lines VD), that overlap the projection of the main body portion Y21 in the second color subpixel spx2 are on a second side of the center of the projection of the main body portion Y21, and the first side and the second side are two opposite sides. In this way, the first sub adapter portion YZ211, the second sub adapter portion YZ212, and the two signal lines, the projections of which overlap the projection of the main body portion Y21 in the second color subpixel spx2, can play a better role of flattening. Further, as shown in FIG. 3 to FIG. 5, in the second color subpixel spx2, the main body portion Y21 partially overlaps the second sub anode adapter portion YZ22. Further, in the second color subpixel spx2, in the second direction, the projection of the anode adapter portion YZ2 on the second side of the center of the projection of the main body portion Y21 completely runs through the projection of the main body portion Y21, and the projections of the signal lines on the first side of the center of the projection of the main body portion Y21 completely run through the projection of the main body portion Y21, to implement a better flattening effect.

For example, as shown in FIG. 3 to FIG. 5, in the third color subpixel spx3, the first sub anode adapter portion YZ31 has a first sub adapter portion YZ311 and a second sub adapter portion YZ312 that are disposed oppositely. An orthographic projection of the first sub adapter portion YZ311 on the base substrate 10 is between an orthogonal projection of the second sub adapter portion YZ312 on the base substrate 10 and orthographic projections, which overlap the orthographic projection of the main body portion Y31 in the third color subpixel spx3 on the base substrate, of the two signal lines (for example, two data lines VD) on the base substrate 10. For example, the first sub adapter portion YZ311 is closer to a center of the main body portion Y31 than the second sub adapter portion YZ312. For example, the orthographic projection of the second sub adapter portion YZ312 on the base substrate 10 overlaps an edge of the orthographic projection of the main body portion Y31 on the base substrate 10. For example, in the first direction F1, projections, which overlap the projection of the main body portion Y31, of parts of the first sub adapter portion YZ311 and the second sub adapter portion YZ312 are on a same side of a center of the projection of the main body portion Y31.

For example, in the first direction F1, the part where the projections of the first sub adapter portion YZ311 and the second sub adapter portion YZ312 overlap with the projection of the main body portion Y31 is on a first side of the center of the projection of the main body portion Y31, projections of the two signal lines (for example, the following first signal line group (for example, two data lines VD) or second signal line group (for example, two data lines VD)) that overlap the projection of the main body portion Y31 in the third color subpixel spx3 are on a second side of the center of the projection of the main body portion Y31, and the first side and the second side are two opposite sides. In this way, the first sub adapter portion YZ311, the second sub adapter portion YZ312, and the two signal lines overlapping the main body portion Y31 in the third color subpixel spx3 can play a better role of flattening. Further, in the third color subpixel spx3, in the second direction, the projections of the signal lines on the first side of the center of the projection of the main body portion Y31 completely run through the projection of the main body portion Y31, to implement a better flattening effect.

For example, as shown in FIG. 3 to FIG. 5, in the third color subpixel spx3, the signal protrusion portion TQ and the anode adapter portion YZ3 overlap in the first direction. Alternatively, a straight line parallel with the second direction may run through the signal protrusion portion TQ and the anode adapter portion YZ3. Further, in the second direction, the signal protrusion portion TQ does not overlap the anode adapter portion YZ3, and at least a part of the anode adapter portion YZ3 is on a side of the center of the main body portion Y31 away from the signal protrusion portion TQ. In this way, the anode adapter portion YZ3 and the signal protrusion portion TQ may be respectively located on two sides of the center of the main body portion Y31, so that the anode Y3 can be flatter. Further, in the third color subpixel spx3, a center of the signal protrusion portion TQ and a center line of the two data lines overlapping the main body portion Y31 in the third color subpixel spx3 are respectively located on two sides of the center of the main body portion Y31. In this way, the anode Y3 can be flatter.

For example, as shown in FIG. 3 to FIG. 5, in the fourth color subpixel spx4, the first sub anode adapter portion YZ41 comprises a first sub adapter portion YZ411 and a second sub adapter portion YZ412 that are disposed oppositely. An orthographic projection of the first sub adapter portion YZ411 on the base substrate 10 is between an orthogonal projection of the second sub adapter portion YZ412 on the substrate 10 and orthographic projections, which overlap the orthographic projection of the main body portion Y41 in the fourth color subpixel spx4 on the base substrate, of the two signal lines (for example, the following first signal line group (for example, two data lines VD) or second signal line group (for example, two data lines VD)) on the base substrate 10. For example, the first sub adapter portion YZ411 is closer to a center of the main body portion Y41 than the second sub adapter portion YZ412. For example, in the first direction F1, parts of the first sub adapter portion YZ411 and the second sub adapter portion YZ412 that overlap the projection of the main body portion Y41 are on a same side of a center of the projection of the main body portion Y41. For example, in the first direction F1, a part, where projections of the first sub adapter portion YZ411 and the second sub adapter portion YZ412 overlap with the projection of the main body portion Y41, is on a first side of the center of the projection of the main body portion Y41, projections of the two signal lines (for example, two data lines VD) that overlap the projection of the main body portion Y41 in the fourth color subpixel spx4 are on a second side of the center of the projection of the main body portion Y41, and the first side and the second side are two opposite sides. In this way, the first sub adapter portion YZ411, the second sub adapter portion YZ412, and the two signal lines, the projections of which overlap the projection of the main body portion Y41 in the fourth color subpixel spx4 can play a better role of flattening. Further, in the fourth color subpixel spx4, the main body portion Y41 completely covers the second sub anode adapter portion YZ42. Further, in the fourth color subpixel spx4, the signal protrusion portion TQ overlapping the main body portion Y41 is on a side of the anode adapter portion YZ4 away from the overlapping main body portion Y41. Further, in the fourth color subpixel spx4, in the second direction, the projections of the signal lines on the first side of the center of the projection of the main body portion Y41 completely run through the projection of the main body portion Y41, to implement a better flattening effect.

For example, as shown in FIG. 3 to FIG. 5, the two signal lines, the projections of which overlap the projection of the main body portion Y21 in the second color subpixel spx2, are on a side of the second color subpixel spx2 close to the first color subpixel spx1 in the same repetition unit, and the anode adapter portion YZ2 in the second color subpixel spx2 is on a side of the second color subpixel spx2 close to the third color subpixel spx3 in the same repetition unit. The two signal lines, the projections of which overlap the projection of the main body portion Y41 in the fourth color subpixel spx4, are on a side of the fourth color subpixel spx4 close to the third color subpixel spx3 in the same repetition unit, and the anode adapter portion YZ4 in the fourth color subpixel spx4 is on a side of the fourth color subpixel spx4 away from the third color subpixel spx3 in the same repetition unit. In this way, the two signal lines, the projections of which overlap the projection of the main body portion Y21 in the second color subpixel spx2, and the two signal lines, the projections of which overlap the projection of the main body portion Y41 in the fourth color subpixel spx4, may be on a same side.

In some examples, as shown in FIG. 3 to FIG. 6A, when the second subpixel 02 includes the second color subpixel spx2, in the second color subpixel spx2, the orthographic projection of the main body portion Y21 on the base substrate 10 overlaps the orthographic projection of the first sub anode adapter portion YZ21 on the base substrate 10. For example, in the second color subpixel spx2, the orthographic projection of the main body portion Y21 on the base substrate 10 overlaps both the orthographic projections of the first sub adapter portion YZ211 and the second sub adapter portion YZ212 on the base substrate 10. For example, the main body portion Y21 in the second color subpixel spx2 has a second main body symmetrical axis in the second direction F2. In addition, in the second color subpixel spx2, a center line, of the parts, where the orthographic projections of the two signal lines (for example, two data lines VD) on the base substrate overlaps with the orthographic projection of the main body portion Y21 on the base substrate 10, of the two signal lines, in the second direction F2 and a center line of the first sub adapter portion YZ211 and the second sub adapter portion YZ212 in the second direction F2 are respectively located on two opposite sides of the second main body symmetrical axis. For example, a ratio of a distance between the center line, of the two signal lines (for example, two data lines VD), the orthographic projections of which on the base substrate overlap the orthographic projection of the main body portion Y21 on the base substrate 10, in the second direction F2 and the second main body symmetrical axis to a distance between the center line of the first sub adapter portion YZ211 and the second sub adapter portion YZ212 in the second direction F2 and the second main body symmetrical axis ranges from 0.8 to 1.2, for example, may be one of 0.8, 0.9, 1.0, 1.1, and 1.2. In this way, the main body portion Y21 is supported by using the data lines VD, the first sub adapter portion YZ211, and the second sub adapter portion YZ212, so that the main body portion Y21 is as flat as possible, to reduce asymmetry of the main body portion Y21. Further, light-emitting asymmetry of the effective light-emitting region EQ can be reduced, and even eliminated, thereby reducing and even eliminating a color cast phenomenon of the display substrate.

In some examples, as shown in FIG. 3 to FIG. 5 and FIG. 6B, when the second subpixel 02 includes the fourth color subpixel spx4, in the fourth color subpixel spx4, the orthographic projection of the main body portion Y41 on the base substrate 10 overlaps the orthographic projection of the second sub anode adapter portion YZ42 on the base substrate 10, and the orthographic projection of the main body portion Y41 on the base substrate 10 overlaps the orthographic projections of the two signal lines (for example, two data lines VD) on the base substrate 10. For example, in the second direction F2, in the fourth color subpixel spx4, an orthographic projection of at least a part of the main body portion Y41 on the base substrate 10 is on a side of the orthographic projection of the second sub anode adapter portion YZ42 on the base substrate 10 away from the orthographic projection of the first sub anode adapter portion YZ41 on the base substrate 10. For example, the main body portion in the fourth color subpixel spx4 has a fourth main body symmetrical axis in the second direction F2. In the fourth color subpixel spx4, a center line, of parts, where the orthographic projections of the two signal lines (for example, two data lines VD) on the base substrate overlaps with the orthographic projection of the main body portion Y41 on the base substrate 10, of the two signal lines, in the second direction F2 and a center line of the second sub anode adapter portion YZ42 in the second direction F2 are respectively located on two opposite sides of the fourth main body symmetrical axis. For example, a ratio of a distance between the center line, of the two signal lines (for example, two data lines VD), the orthographic projections of which on the base substrate overlap the orthographic projection of the main body portion Y41 on the base substrate 10, in the second direction F2 and the fourth main body symmetrical axis to a distance between the center line of the second sub anode adapter portion YZ42 in the second direction F2 and the fourth main body symmetrical axis ranges from 0.8 to 1.2, for example, may be one of 0.8, 1.0, and 1.2. Further, in the second direction, for example, in a same column, the orthographic projection of the main body portion Y41 in the fourth color subpixel spx4 on the base substrate 10 overlaps the orthographic projection of the signal protrusion portion in the adjacent second color subpixel spx2 on the base substrate 10. In this way, the main body portion Y41 is supported by using the data lines VD, the second sub anode adapter portion YZ42, and the signal protrusion portion, so that the main body portion Y41 is as flat as possible, to reduce asymmetry of the main body portion Y41. Further, light-emitting asymmetry of the effective light-emitting region EQ can be reduced, and even eliminated, thereby reducing and even eliminating a color cast phenomenon of the display substrate.

In some examples, as shown in FIG. 3 to FIG. 5, an area of an orthographic projection of a second sub anode adapter portion YZ42 in one fourth color subpixel spx4 on the base substrate 10 is greater than an area of an orthographic projection of a second sub anode adapter portion YZ22 in one second color subpixel spx2 on the base substrate 10. For example, the orthographic projection of the second sub anode adapter portion YZ22 in the second color subpixel spx2 on the base substrate 10 has a second width W2 in the second direction F2, the orthographic projection of the second sub anode adapter portion YZ42 in the fourth color subpixel spx4 on the base substrate 10 has a fourth width W4 in the second direction F2, and the fourth width W4 is greater than the second width W2.

For example, as shown in FIG. 4E, the orthographic projection of the second sub anode adapter portion YZ22 in the second color subpixel spx2 on the base substrate 10 has a first width W1 in the first direction F1, and W2:W1 may be set to 1.5:1. In actual applications, sizes of different second color subpixels spx2 impose different requirements on values of the first width W1 and the second width W2. Therefore, the values of the first width W1 and the second width W2 are set based on a requirement of an actual application with reference to a condition of setting W2:W1 to 1.5:1, and this is not limited herein. For example, the second width W2 may range from 5 micrometers to 18 micrometers. For example, the second width W2 may range from 10 micrometers to 15 micrometers. For example, the second width W2 may be 5 micrometers, the second width W2 may be 10 micrometers, the second width W2 may be 12 micrometers, the second width W2 may be 15 micrometers, or the second width W2 may be 18 micrometers. For example, the first width W1 may range from 4 micrometers to 15 micrometers. For example, the first width W1 ranges from 8 micrometers to 12 micrometers. For example, the first width W1 may be 4 micrometers, the first width W1 may be 8 micrometers, the first width W1 may be 10 micrometers, the first width W1 may be 12 micrometers, or the first width W1 may be 15 micrometers. For example, a size of the second sub anode adapter portion YZ22 at least needs to be greater than a size of the via hole. For example, the size of the via hole is approximately 5*5 micrometers. For example, the size of the via hole is approximately 4*4 micrometers. For example, the size of the via hole is approximately 3*4 micrometers. For example, the size of the via hole is approximately 3*3 micrometers. For example, the via hole is the round hole with a diameter in the range of 2 micrometers to 5 micrometers.

For example, as shown in FIG. 4E, the orthographic projection of the second sub anode adapter portion YZ32 in the third color subpixel spx3 on the base substrate 10 has a fifth width W5 in the first direction F1, the orthographic projection of the second sub anode adapter portion YZ32 in the third color subpixel spx3 on the base substrate 10 has a sixth width W6 in the second direction F2, and W6:W5 may be set to 1.5:1. In actual applications, sizes of different third color subpixels spx3 impose different requirements on values of the fifth width W5 and the sixth width W6. Therefore, the values of the fifth width W5 and the sixth width W6 are set based on a requirement of an actual application with reference to a condition of setting W6:W5 to 1.5:1, and this is not limited herein. For example, the sixth width W6 may range from 5 micrometers to 18 micrometers. For example, the sixth width W6 may range from 10 micrometers to 15 micrometers. For example, the sixth width W6 may be 5 micrometers, the sixth width W6 may be 10 micrometers, the sixth width W6 may be 12 micrometers, the sixth width W6 may be 15 micrometers, or the sixth width W6 may be 18 micrometers. For example, the fifth width W5 may range from 4 micrometers to 18 micrometers. For example, the fifth width W5 ranges from 8 micrometers to 15 micrometers. For example, the fifth width W5 may be 4 micrometers, the fifth width W5 may be 8 micrometers, the fifth width W5 may be 10 micrometers, the fifth width W5 may be 15 micrometers, or the fifth width W5 may be 18 micrometers. For example, a size of the second sub anode adapter portion YZ32 at least needs to be greater than a size of the via hole. For example, the size of the via hole is approximately 5*5 micrometers. For example, the size of the via hole is approximately 4*4 micrometers. For example, the size of the via hole is approximately 3*4 micrometers. For example, the size of the via hole is approximately 3*3 micrometers. For example, the via hole is a round hole with a diameter in the range of 2 micrometers to 5 micrometers.

For example, as shown in FIG. 4E and FIG. 5, the orthographic projection of the second sub anode adapter portion YZ42 in the fourth color subpixel spx4 on the base substrate 10 has a third width W3 in the first direction F1 and has a fourth width W4 in the second direction F2, and W4:W3 may be set to 2:1. For example, a center of the opening region in the fourth color subpixel spx4 is farther away from the anode adapter portion or a center point of a size of the anode adapter portion in the second direction than a center of an opening region in another subpixel (for example, at least one of spx1, spx2, and spx3). Therefore, a size of the second sub anode adapter portion YZ42 in the fourth color subpixel spx4 in the second direction is greater than that of another subpixel. For example, sizes of second sub anode adapter portions in the subpixels in the first direction are approximately equal. In actual applications, sizes of different fourth color subpixel spx4 impose different requirements on values of the third width W3 and the fourth width W4. Therefore, the values of the third width W3 and the fourth width W4 are set based on a requirement of an actual application with reference to a condition of setting W4:W3 to 2:1, and this is not limited herein. For example, the fourth width W4 may range from 10 micrometers to 30 micrometers. For example, the fourth width W4 may range from 14 micrometers to 25 micrometers. For example, the fourth width W4 may range from 16 micrometers to 24 micrometers. For example, the fourth width W4 may be 10 micrometers, the fourth width W4 may be 14 micrometers, the fourth width W4 may be 16 micrometers, the fourth width W4 may be 20 micrometers, the fourth width W4 may be 24 micrometers, the fourth width W4 may be 25 micrometers, or the fourth width W4 may be 30 micrometers. For example, the third width W3 ranges from 8 micrometers to 15 micrometers. For example, the third width W3 ranges from 10 micrometers to 13 micrometers. For example, the third width W3 may be 8 micrometers, the third width W3 may be 10 micrometers, the third width W3 may be 12 micrometers, the third width W3 may be 13 micrometers, or the third width W3 may be 15 micrometers. Further, a size of the second sub anode adapter portion YZ42 at least needs to be greater than a size of the via hole. For example, the size of the via hole is approximately 5*5 micrometers. For example, the size of the via hole is approximately 4*4 micrometers. For example, the size of the via hole is approximately 3*4 micrometers. For example, the size of the via hole is approximately 3*3 micrometers. For example, the via hole is a round hole with a diameter in the range of 2 micrometers to 5 micrometers.

For example, as shown in FIG. 4E, the orthographic projection of the anode adapter portion YZ1 in the first color subpixel spx1 on the base substrate 10 has a seventh width W7 in the first direction F1, the orthographic projection of the anode adapter portion YZ1 in the first color subpixel spx1 on the base substrate 10 has an eighth width W8 in the second direction F2, and W8:W7 may be set to 1.5:1. In actual applications, sizes of different first color subpixels spx1 impose different requirements on values of the seventh width W7 and the eighth width W8. Therefore, the values of the seventh width W7 and the eighth width W8 are set based on a requirement of an actual application with reference to a condition of setting W8:W7 to 1.5:1, and this is not limited herein. For example, the eighth width W8 may range from 5 micrometers to 18 micrometers. For example, the eighth width W8 may range from 10 micrometers to 15 micrometers. For example, the eighth width W8 may be 5 micrometers, the eighth width W8 may be 10 micrometers, the eighth width W8 may be 13 micrometers, the eighth width W8 may be 15 micrometers, or the eighth width W8 may be 18 micrometers. For example, the seventh width W7 may range from 4 micrometers to 15 micrometers. For example, the seventh width W7 ranges from 8 micrometers to 12 micrometers. For example, the seventh width W7 may be 4 micrometers, the seventh width W7 may be 8 micrometers, the seventh width W7 may be 10 micrometers, the seventh width W7 may be 12 micrometers, or the seventh width W7 may be 15 micrometers. For example, a size of the second sub anode adapter portion YZ12 at least needs to be greater than a size of the via hole. For example, the size of the via hole is approximately 5*5 micrometers. For example, the size of the via hole is approximately 4*4 micrometers. For example, the size of the via hole is approximately 3*4 micrometers. For example, the size of the via hole is approximately 3*3 micrometers. For example, the via hole is a round hole with a diameter in the range of 2 micrometers to 5 micrometers.

In some examples, as shown in FIG. 3 to FIG. 5 and FIG. 6C, when the second subpixel 02 includes the third color subpixel spx3, in the third color subpixel spx3, the orthographic projection of the main body portion Y31 on the base substrate 10 overlaps the orthographic projection of the first sub anode adapter portion YZ31 on the base substrate 10, and the orthographic projection of the main body portion Y31 on the base substrate 10 overlaps the orthographic projections of the two signal lines (for example, two data lines VD) on the base substrate 10. For example, in the third color subpixel spx3, the orthographic projection of the main body portion Y31 on the base substrate 10 overlaps both the orthographic projections of the first sub adapter portion YZ311 and the second sub adapter portion YZ312 on the base substrate 10. For example, the main body portion Y31 in the third color subpixel spx3 has a third main body symmetrical axis in the second direction F2. In addition, in the third color subpixel spx3, a center line, of parts, where the orthographic projections of the two signal lines (for example, two data lines VD) on the base substrate overlaps with the orthographic projection of the main body portion Y31 on the base substrate 10, of the two signal lines, in the second direction F2 and a center line of the first sub adapter portion YZ311 and the second sub adapter portion YZ312 in the second direction F2 are respectively located on two opposite sides of the third main body symmetrical axis. For example, a ratio of a distance between the center line, of the two signal lines (for example, two data lines VD), the orthographic projections of which on the base substrate overlap the orthographic projection of the main body portion Y31 on the base substrate 10, in the second direction F2 and the third main body symmetrical axis to a distance between the center line of the first sub adapter portion YZ311 and the second sub adapter portion YZ312 in the second direction F2 and the third main body symmetrical axis ranges from 0.8 to 1.2, for example, may be one of 0.8, 0.9, 1.0, 1.1, and 1.2. Further, in the third color subpixel spx3, the orthographic projection of the main body portion Y31 on the base substrate 10 covers the orthographic projection of the signal protrusion portion on the base substrate 10. For example, in the third color subpixel spx3, the signal protrusion portion is on a side of the first sub anode adapter portion YZ31 away from the second sub anode adapter portion YZ32.

In some examples, as shown in FIG. 3 and FIG. 4E, the signal protrusion portion TQ includes a protrusion portion main body tq1 and a connection portion tq2 connecting the protrusion portion main body tq1 and the data line VD. For example, the signal protrusion portion TQ electrically connect a signal line and another film layer, generally, through a via hole. For example, the protrusion portion main body tq1 is provided with a via hole through which the data line VD is connected with another film layer and the data line VD that is integrally connected to the protrusion portion main body tq1. Therefore, sizes of the protrusion portion main body tq1 in the first direction F1 and the second direction F2 cannot be excessively small, and at least need to be greater than a size of the via hole. For example, the size of the via hole is 4*4 micrometers. For example, the size of the via hole is 3*3 micrometers. For example, the via hole is a round hole with a diameter in the range of 2 micrometers to 4 micrometers. For example, a data signal for display of each subpixel is transmitted on the protrusion portion main body tq1. To reduce interference with another signal, sizes of the protrusion portion main body tq1 in the first direction F1 and the second direction F2 cannot be excessively large. For example, in the first direction F1, an interval is disposed between the protrusion portion main body tq1 and another adjacent signal line such as a data line. The interval, for example, ranges from 3 micrometers to 18 micrometers. For examples, an interval between a first protrusion portion, of a data line VD, connected one of an odd-numbered row and an even-numbered row and an adjacent data line is different from an interval between a second protrusion portion connected the other one of the odd-numbered row and the even-numbered row and an adjacent data line. For example, a signal protrusion portion main body tq1 connected to an odd-numbered row is a first protrusion portion T1, a signal protrusion portion main body tq1 connected to an even-numbered row is a second protrusion portion T2, and an interval between the first protrusion portion T1 and an adjacent data line is different from an interval between the second protrusion portion and an adjacent data line. For example, a first protrusion portion T1 and a second protrusion portion T2 in a same column are arranged in the second direction F2 in an alternating manner. For example, the interval between the first protrusion portion T1 and another adjacent data line ranges from 3 micrometers to 8 micrometers. For example, the interval between the second protrusion portion T2 and another adjacent data line ranges from 6 micrometers to 18 micrometers. For example, sizes of the first protrusion portion T1 and the second protrusion portion T2 are approximately equal to each other. For example, a shape of each of the first protrusion portion T1 and the second protrusion portion T2 is approximately a rectangle. For example, a size, of a connection portion tq2 connecting the first protrusion portion T1 and the data line, in the first direction F1 approximately ranges from 6 micrometers to 20 micrometers. For example, a size, of a connection portion tq2 connecting the second protrusion portion T2 and the data line, in the first direction F1 approximately ranges from 3 micrometers to 8 micrometers. For example, there are two adjacent data lines between two adjacent pixel circuit regions. Protrusion portions corresponding to the two data lines are approximately flush, in other words, are approximately at a same height in the second direction F2. In addition, one data line includes a first protrusion portion T1, and the other data line includes a second protrusion portion T2.

In some examples, as shown in FIG. 3 to FIG. 5, a ratio of a distance between a first sub adapter portion and a second sub adapter portion of a same first sub anode adapter portion in the first direction F1 to a distance between two signal lines in the first direction F1 may range from 0.8 to 1.2. For example, the ratio of the distance between the first sub adapter portion and the second sub adapter portion of the same first sub anode adapter portion in the first direction F1 to the distance between the two signal lines in the first direction F1 may be 0.8, 1.0, 1.1, or 1.2.

In some examples, as shown in FIG. 3 to FIG. 5, the distance between the first sub adapter portion and the second sub adapter portion of the same first sub anode adapter portion in the first direction F1 and the distance between the two signal lines in the first direction F1 are approximately the same. For example, in the second color subpixel spx2, a distance H1 between the first sub adapter portion YZ211 and the second sub adapter portion YZ212 of the same first sub anode adapter portion YZ21 in the first direction F1 and a distance H2 between the two signal lines (for example, two data lines VD) in the first direction F1 are approximately the same. In the third color subpixel spx3, a distance H1 between the first sub adapter portion YZ311 and the second sub adapter portion YZ312 of the same first sub anode adapter portion YZ31 in the first direction F1 and a distance H2 between the two signal lines (for example, two data lines VD) in the first direction F1 are approximately the same. In the fourth color subpixel spx4, a distance H1 between the first sub adapter portion YZ411 and the second sub adapter portion YZ412 of the same first sub anode adapter portion YZ41 in the first direction F1 and a distance H2 between the two signal lines (for example, two data lines VD) in the first direction F1 are approximately the same.

For example, the distance H2 may be set to 5 μm to 7 μm. For example, the distance H2 may be set to 5 μm, the distance H2 may be set to 6 μm, or the distance H2 may be set to 7 μm. Certainly, in actual applications, a specific value of the distance H2 may be determined based on a requirement of an actual application. This is not limited herein.

For example, the distance H1 may be set to 5 μm to 6 μm. For example, the distance H1 may be set to 5 μm, the distance H1 may be set to 5.5 μm, or the distance H1 may be set to 6 μm. Certainly, in actual applications, a specific value of the distance H1 may be determined based on a requirement of an actual application. This is not limited herein.

Based on a same invention idea, an embodiment of the present disclosure further provides a display apparatus, including the electroluminescent display substrate provided in the embodiments of the present disclosure. The display apparatus may be any product or component having a display function, for example, a mobile phone, a tablet computer, a television, a display, a notebook computer, a digital photo frame, or a navigator. A person of ordinary skill in the art should understand that the display apparatus includes other necessary components, and this should not be construed as limitation on the present disclosure. Details are not described herein. For implementation of the display apparatus, refer to the embodiment of the electroluminescent display substrate. Repeated descriptions are not described again.

Although some preferred embodiments of the present disclosure have been described, a person skilled in the art can make other changes and modifications to these embodiments once learning the basic inventive concept. Therefore, the appended claims are intended to be construed as to cover the preferred embodiments and all changes and modifications that fall within the scope of the present disclosure.

Apparently, a person skilled in the art can make various modifications and variations to the embodiments of the present disclosure without departing from the spirit and scope of the embodiments of the present disclosure. The present disclosure is intended to cover these modifications and variations of the embodiments of the present disclosure provided that the modifications and variations fall within the scope of the claims of the present disclosure and their equivalent technologies.

What is claimed is:

1. A display substrate, comprising:
   multiple subpixels, wherein at least one of the multiple subpixels comprises a pixel circuit and a light-emitting element that are on a base substrate, and the pixel circuit comprises a drive transistor, configured to drive the light-emitting element to emit light;
   an active semiconductor layer, wherein a drive active layer of the drive transistor is in the active semiconductor layer, and a drive gate of the drive transistor is electrically connected to the active semiconductor layer through a drive via hole;
   a first conducting layer, on a side of the active semiconductor layer away from the base substrate, wherein the first conducting layer comprises anode adapter portions and signal lines that are disposed at intervals; and
   a first insulation layer, on a side of the first conducting layer away from the base substrate, wherein the first insulation layer comprises first via holes, and the first via holes expose at least a part of the anode adapter portions;
   wherein in each of the subpixels, an orthographic projection of at least a part of the drive via hole on the base substrate does not overlap orthographic projections of an anode adapter portion and signal lines on the base substrate;
   the light-emitting element comprises an anode, the anode is on a side of the first insulation layer away from the base substrate, the anode comprises a main body portion and an auxiliary portion that are electrically connected, and the auxiliary portion is electrically connected to the anode adapter portion through the first via hole;
   the multiple subpixels comprise first subpixels and second subpixels;
   in each of the first subpixels, an orthographic projection of the anode adapter portion on the base substrate does not overlap an orthographic projection of the drive active layer on the base substrate, and an orthographic projection of the main body portion on the base substrate does not overlap the orthographic projection of the anode adapter portion on the base substrate; and
   in each of the second subpixels, an orthographic projection of the anode adapter portion on the base substrate overlaps an orthographic projection of the drive active layer on the base substrate, and an orthographic projection of the main body portion on the base substrate overlaps the orthographic projection of the anode adapter portion on the base substrate.

2. The display substrate according to claim 1, wherein the anode adapter portion in the second subpixel comprises a first sub anode adapter portion and a second sub anode adapter portion that are electrically connected, the first sub anode adapter portion has a hollow-out structure, the second sub anode adapter portion has a solid structure, and the auxiliary portion is electrically connected to the second sub anode adapter portion through the first via hole; and
   in the second subpixel, an orthographic projection of the first sub anode adapter portion on the base substrate overlaps the orthographic projection of the drive active layer on the base substrate.

3. The display substrate according to claim 2, further comprising:

a gate conducting layer between the active semiconductor layer and the first conducting layer; wherein the gate conducting layer comprises a scanning line;

in a direction parallel with the base substrate, in the same second subpixel, an orthographic projection of the scanning line on the base substrate is on a side of the orthographic projection of the drive active layer on the base substrate away from an orthographic projection of the second sub anode adapter portion on the base substrate; and in the second subpixel, the orthographic projection of the first sub anode adapter portion on the base substrate overlaps the orthographic projection of the scanning line on the base substrate.

4. The display substrate according to claim 2, wherein in the second subpixel, an orthographic projection of a hollow-out region of the hollow-out structure of the first sub anode adapter portion on the base substrate overlaps an orthographic projection of the drive via hole on the base substrate;

wherein the first sub anode adapter portion comprises a first sub adapter portion and a second sub adapter portion that are disposed oppositely; and in the second subpixel, the orthographic projection of the main body portion on the base substrate overlaps orthographic projections of two signal lines on the base substrate, and in a first direction, an orthographic projection of the first sub adapter portion on the base substrate is between an orthographic projection of the second sub adapter portion on the base substrate and the orthographic projections of the two signal lines on the base substrate.

5. The display substrate according to claim 4, wherein a ratio of a distance between a first sub adapter portion and a second sub adapter portion of the same first sub anode adapter portion in the first direction to a distance between the two signal lines in the first direction ranges from 0.8 to 1.2.

6. The display substrate according to claim 1, wherein at least one of multiple repetition units comprises a first color subpixel, a second color subpixel, a third color subpixel, and a fourth color subpixel, the multiple repetition units are arranged in the first direction to form repetition unit groups, the repetition unit groups are arranged in a second direction, and the first direction is different from the second direction;

the first subpixel comprises the first color subpixel; and the second subpixel comprises at least one of the second color subpixel, the third color subpixel, and the fourth color subpixel.

7. The display substrate according to claim 6, wherein the second subpixel comprises the second color subpixel;

in the second color subpixel, an orthographic projection of the main body portion on the base substrate overlaps an orthographic projection of a first sub anode adapter portion on the base substrate; and in the second color subpixel, the orthographic projection of the main body portion on the base substrate overlaps both of an orthographic projection of a first sub adapter portion on the base substrate and an orthographic projection of a second sub adapter portion on the base substrate.

8. The display substrate according to claim 7, wherein the main body portion in the second color subpixel has a second main body symmetrical axis in the second direction; and in the second color subpixel, a center line, of parts, where the orthographic projections of the two signal lines on the base substrate overlap with the orthographic projection of the main body portion on the base substrate, of the two signal lines, in the second direction and a center line of the first sub adapter portion and the second sub adapter portion in the second direction are respectively on two opposite sides of the second main body symmetrical axis.

9. The display substrate according to claim 7, wherein an area of an orthographic projection of a second sub anode adapter portion in one fourth color subpixel on the base substrate is greater than an area of an orthographic projection of a second sub anode adapter portion in one second color subpixel on the base substrate.

10. The display substrate according to claim 9, wherein the orthographic projection of a second sub anode adapter portion in the second color subpixel on the base substrate has a second width in the second direction, the orthographic projection of the second sub anode adapter portion in the fourth color subpixel on the base substrate has a fourth width in the second direction, and the fourth width is greater than the second width.

11. The display substrate according to claim 6, wherein the second subpixel comprises the fourth color subpixel;

in the fourth color subpixel, an orthographic projection of the main body portion on the base substrate overlaps an orthographic projection of a second sub anode adapter portion on the base substrate, and the orthographic projection of the main body portion on the base substrate overlaps orthographic projections of two signal lines on the base substrate; and in the second direction, in the fourth color subpixel, an orthographic projection of at least a part of the main body portion on the base substrate is on a side of the orthographic projection of the second sub anode adapter portion on the base substrate away from an orthographic projection of a first sub anode adapter portion on the base substrate.

12. The display substrate according to claim 11, wherein the main body portion in the fourth color subpixel has a fourth main body symmetrical axis in the second direction; and in the fourth color subpixel, a center line, of parts, where the orthographic projections of the two signal lines on the base substrate overlap with the orthographic projection of the main body portion on the base substrate, of the two signal lines, in the second direction and a center line of the second sub anode adapter portion in the second direction are respectively on two opposite sides of the fourth main body symmetrical axis.

13. The display substrate according to claim 12, wherein each of the signal lines further comprises a signal protrusion portion, the multiple signal lines comprise first signal lines and second signal lines, one column of subpixels corresponds to one first signal line and one second signal line, a signal protrusion portion of the first signal line is electrically connected to subpixels in an odd-numbered row, and a signal protrusion portion of the second signal line is electrically connected to subpixels in an even-numbered row;

the second color subpixel and the fourth color subpixel respectively located in repetition units that are adjacent to each other in the second direction are adjacent in the second direction; and in the second direction, the orthographic projection of the main body portion in the fourth color subpixel on the base substrate overlaps an orthographic projection of a signal protrusion portion in the adjacent second color subpixel on the base substrate; or each of the signal lines further comprises a signal protrusion portion, the multiple signal lines comprise first signal lines and second signal lines, one column of subpixels corresponds to one first signal line and one second signal line, a signal protrusion portion of the first signal line is electrically connected to subpixels in an odd-numbered row, and a signal protrusion portion of the second signal line is electrically connected to subpixels in an even-numbered row; and in two first signal lines and two second signal lines that correspond to two adjacent columns of subpixels, the two first signal lines are adjacent to form a first signal line group, or the two second signal lines are adjacent to form a second signal line group.

14. The display substrate according to claim 6, wherein the second subpixel comprises the third color subpixel; and in the third color subpixel, an orthographic projection of the main body portion on the base substrate overlaps an orthographic projection of a first sub anode adapter portion on the base substrate, and the orthographic projection of the main body portion on the base substrate overlaps orthographic projections of two signal lines on the base substrate;

wherein in the third color subpixel, the orthographic projection of the main body portion on the base substrate overlaps both of an orthographic projection of a first sub adapter portion on the base substrate and an orthographic projection of a second sub adapter portion on the base substrate.

15. The display substrate according to claim 14, wherein the main body portion in the third color subpixel has a third main body symmetrical axis in the second direction; and in the third color subpixel, a center line, of parts, where the orthographic projections of the two signal lines on the base substrate overlap with the orthographic projection of the main body portion on the base substrate, of the two signal lines, in the second direction and a center line of the first sub adapter portion and the second sub adapter portion in the second direction are respectively located on two opposite sides of the third main body symmetrical axis.

16. The display substrate according to claim 15, wherein in the third color subpixel, the orthographic projection of the main body portion on the base substrate overlaps an orthographic projection of a signal protrusion portion on the base substrate; and in the third color subpixel, the signal protrusion portion is on a side of the first sub anode adapter portion away from the second sub anode adapter portion.

17. The display substrate according to claim 6, wherein in the first color subpixel, an orthographic projection of the main body portion on the base substrate overlaps orthographic projections of two signal lines on the base substrate, and the orthographic projection of the main body portion on the base substrate does not overlap orthographic projections of an anode adapter portion and a signal protrusion portion on the base substrate;

wherein the main body portion in the first color subpixel has a first main body symmetrical axis in the second direction; and in the first color subpixel, in the second direction, the two signal lines, the orthographic projections of which on the base substrate overlaps the orthographic projection of the main body portion on the base substrate, are respectively located on two opposite sides of the first main body symmetrical axis.

18. The display substrate according to claim 1, wherein the signal lines are configured as data lines used to transmit data signals.

19. A display apparatus, comprising the display substrate according to claim 1.

* * * * *